United States Patent
Yun

(10) Patent No.: US 10,535,389 B2
(45) Date of Patent: Jan. 14, 2020

(54) CONTROLLER AND METHOD OF OPERATING THE SAME

(71) Applicant: SK hynix Inc., Gyeonggi-do (KR)

(72) Inventor: Ho Jung Yun, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/189,105

(22) Filed: Nov. 13, 2018

(65) Prior Publication Data

US 2019/0333556 A1 Oct. 31, 2019

(30) Foreign Application Priority Data

Apr. 26, 2018 (KR) ........................ 10-2018-0048743

(51) Int. Cl.
| | | |
|---|---|---|
| G11C 7/00 | (2006.01) | |
| G11C 8/18 | (2006.01) | |
| G11C 11/408 | (2006.01) | |
| G11C 11/4096 | (2006.01) | |
| G11C 29/38 | (2006.01) | |
| G11C 11/4093 | (2006.01) | |
| G11C 29/44 | (2006.01) | |

(52) U.S. Cl.
CPC ............ *G11C 8/18* (2013.01); *G11C 11/4087* (2013.01); *G11C 11/4093* (2013.01); *G11C 11/4096* (2013.01); *G11C 29/38* (2013.01); *G11C 2029/4402* (2013.01)

(58) Field of Classification Search
CPC ................................ G11C 7/1093; G11C 8/18
See application file for complete search history.

(56) References Cited

U.S. PATENT DOCUMENTS 8,081,527 B1 * 12/2011 Venkataraman .... G06F 13/1689
365/154
2011/0298511 A1 * 12/2011 Swanson ............... G11C 7/1093
327/160

FOREIGN PATENT DOCUMENTS

| KR | 1020130016810 | 2/2013 |
| KR | 1020150005297 | 1/2015 |

* cited by examiner

*Primary Examiner* — Tuan T Nguyen
(74) *Attorney, Agent, or Firm* — IP & T Group LLP

(57) ABSTRACT

Provided is a method of operating a controller to control an operation of a semiconductor memory device. The method includes: determining a minimum pass tapped delay of the semiconductor memory device based on a first offset; determining a maximum pass tapped delay of the semiconductor memory device based on a second offset; and determining a tapped delay of the semiconductor memory device based on the determined minimum pass tapped delay and the determined maximum pass tapped delay.

22 Claims, 22 Drawing Sheets

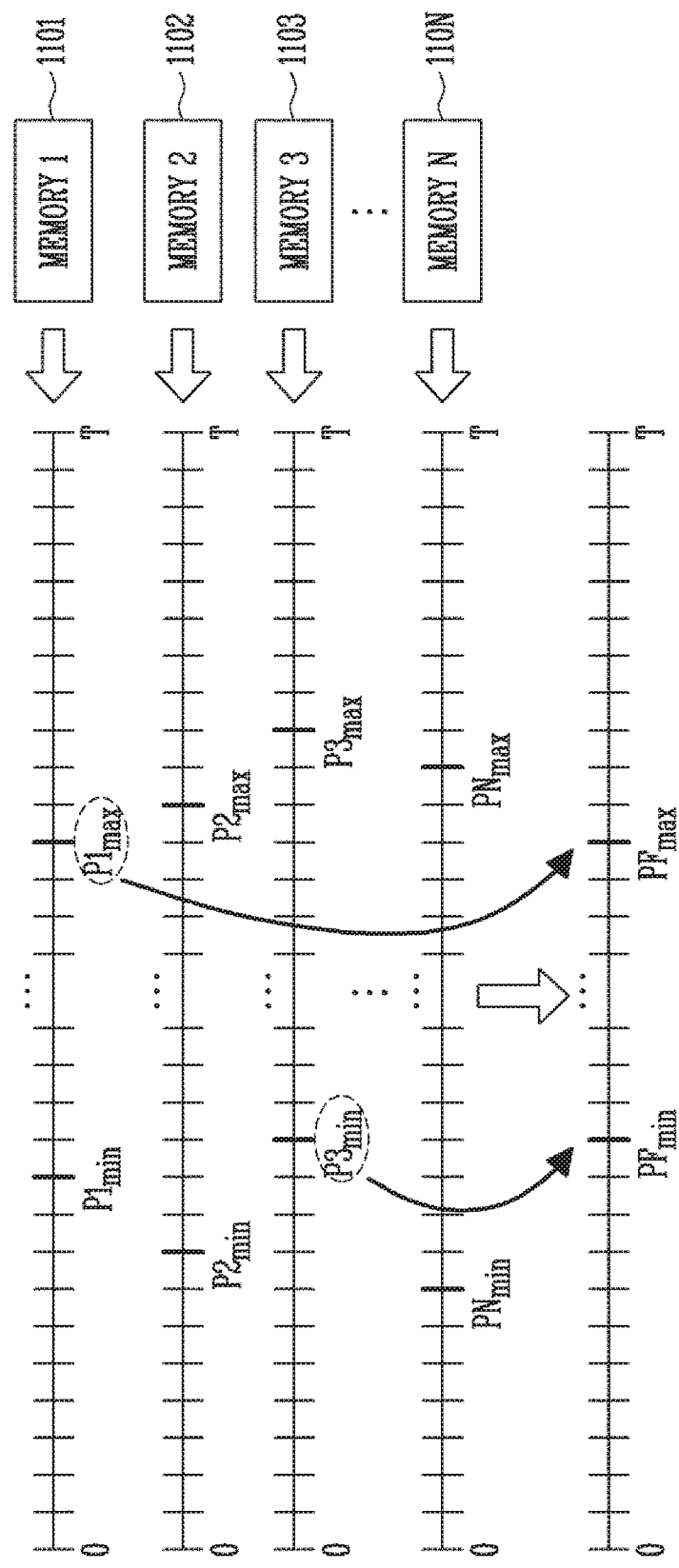

FIG. 18

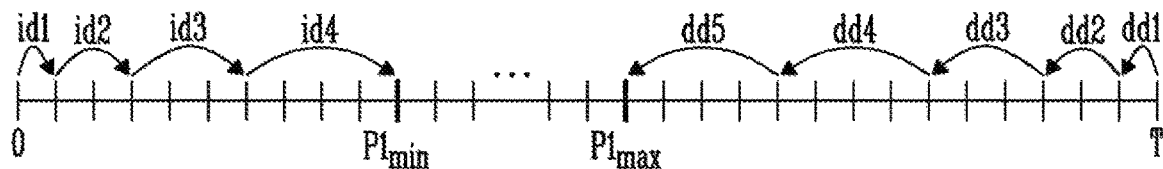

FIG. 19A

| OFFSET | id1 | id2 | id3 | id4 | id5 |
|---|---|---|---|---|---|
| MEMORY 1 | Fail | Fail | Fail | Pass | Pass |
| MEMORY 2 | Fail | Pass | Pass | Pass | Pass |
| MEMORY 3 | Fail | Fail | Pass | Pass | Pass |
| MEMORY 4 | Fail | Pass | Pass | Pass | Pass |
| ... | ... | ... | ... | ... | ... |
| MEMORY N | Fail | Fail | Pass | Pass | Pass |

FIG. 19B

| OFFSET | dd1 | dd2 | dd3 | dd4 | dd5 | dd6 |
|---|---|---|---|---|---|---|
| MEMORY 1 | Fail | Fail | Fail | Pass | Pass | Pass |
| MEMORY 2 | Fail | Fail | Pass | Pass | Pass | Pass |
| MEMORY 3 | Fail | Fail | Fail | Fail | Pass | Pass |
| MEMORY 4 | Fail | Fail | Fail | Pass | Pass | Pass |
| ... | ... | ... | ... | ... | ... | ... |
| MEMORY N | Fail | Fail | Pass | Pass | Pass | Pass |

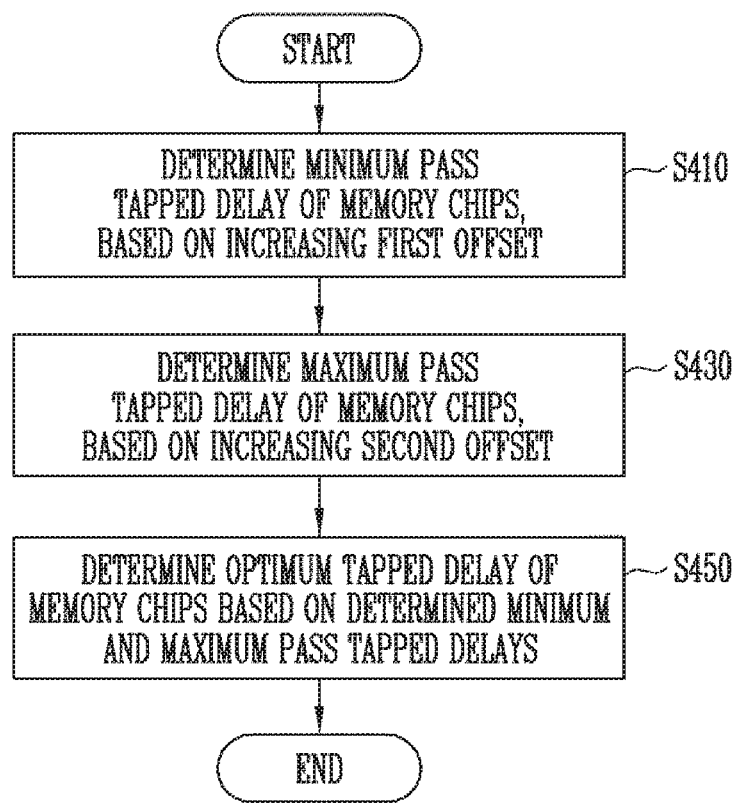

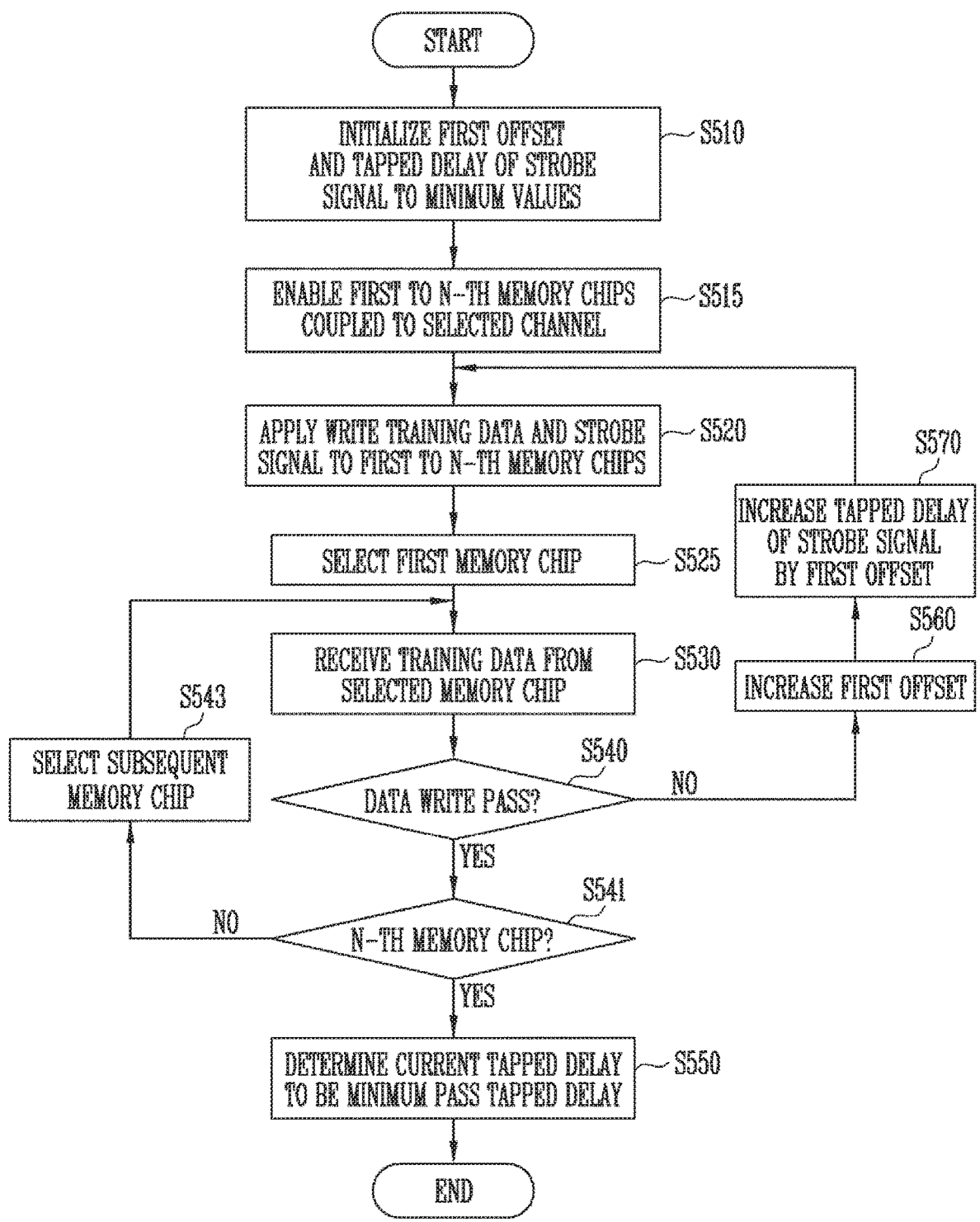

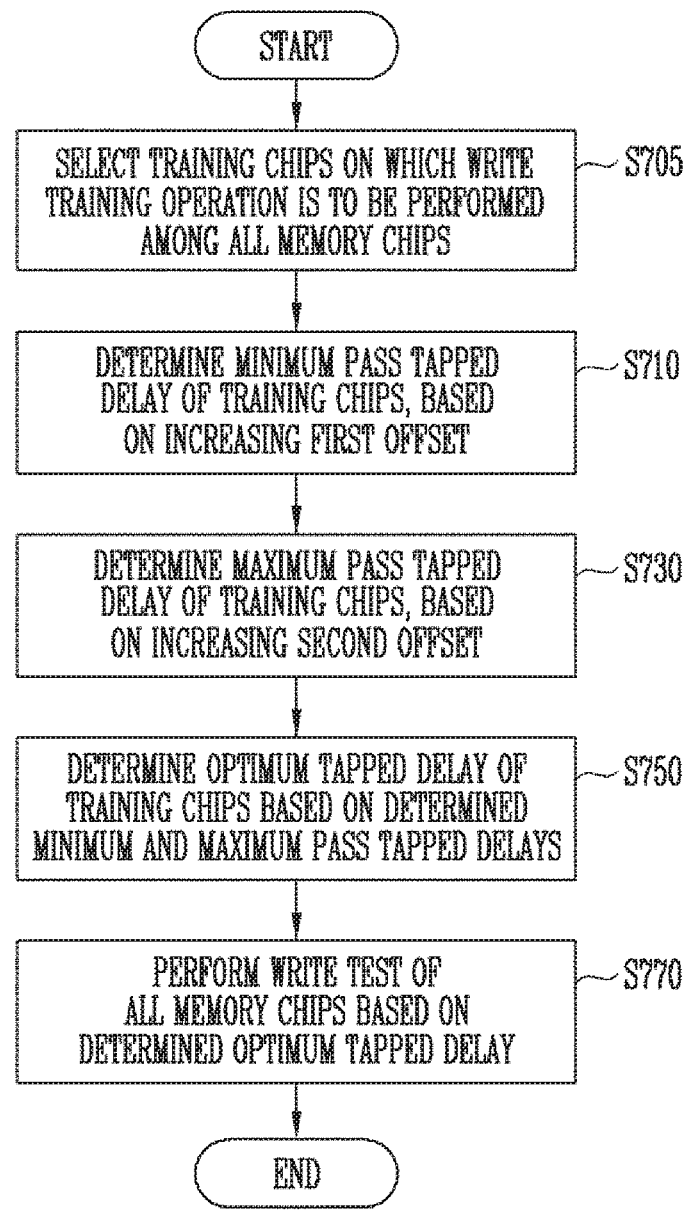

CONTROLLER AND METHOD OF OPERATING THE SAME

CROSS-REFERENCE TO RELATED APPLICATION

The present application claims priority under 35 U.S.C. § 119(a) to Korean patent application number 10-2018-0048743, filed on Apr. 26, 2018, which is incorporated herein by reference in its entirety.

BACKGROUND

Field of Invention

Various embodiments of the present disclosure generally relate to an electronic device. Particularly, the embodiments relate to a controller and a method of operating the controller.

Description of Related Art

Generally, a semiconductor memory device may have a two-dimensional structure in which strings are horizontally arranged on a semiconductor substrate, or a three-dimensional structure in which strings are vertically stacked on a semiconductor substrate. The three-dimensional memory device was devised to overcome a limitation in the degree of integration of the two-dimensional memory device, and may include a plurality of memory cells which are vertically stacked on a semiconductor substrate.

SUMMARY

Various embodiments of the present disclosure are directed to a method of operating a controller capable of enhancing a write training speed of a semiconductor memory device.

Various embodiments of the present disclosure are directed to a controller capable of enhancing a write training speed of a semiconductor memory device.

An embodiment of the present disclosure may provide for a method of operating a controller to control an operation of a semiconductor memory device, the method including: determining a minimum pass tapped delay of the semiconductor memory device based on a first offset; determining a maximum pass tapped delay of the semiconductor memory device based on a second offset; and determining a tapped delay of the semiconductor memory device based on the determined minimum pass tapped delay and the determined maximum pass tapped delay.

An embodiment of the present disclosure may provide for a method of operating a controller to control a plurality of memory chips sharing a channel, the method including: determining a minimum pass tapped delay of the plurality of memory chips based on a first offset; determining a maximum pass tapped delay of the plurality of memory chips based on a second offset; and determining a tapped delay of the plurality of semiconductor memory chips, based on the determined minimum pass tapped delay and the determined maximum pass tapped delay.

An embodiment of the present disclosure may provide for a controller configured to control an operation of a semiconductor memory device, the controller including: a write pass determination component configured to receive training data written to the semiconductor memory device, and determine whether a write operation of the semiconductor memory device has passed; an offset storage configured to update an offset based on the determination of the write pass determination component, and store the updated offset; and a tapped delay storage configured to update, based on the updated offset, a tapped delay to be applied to the write operation of the semiconductor memory device, and store the updated tapped delay.

An embodiment of the present disclosure may provide for a controller for performing write test operations to at least one memory device, the controller comprising: a processor configured to control the at least one memory device to perform first and second write operations of writing test data thereto, each of the first and second write operations being performed according to respective first and second tapped delays between a data signal and a data strobe signal; a write pass determination component configured to determine success or failure of each of the first and second write operations; an offset storage configured to store an increasing increment at each successive failure of the first write operations and an increasing decrement at each successive failure of the second write operations; and a tapped delay storage configured to store the first tapped delay increased by the amount of the increasing increment and the second tapped delay decreased by the amount of the increasing decrement. The processor is, during the first and second write operations of the at least one memory device, configured to: determine a minimum pass tapped delay by increasing stepwise, from a minimum tapped delay, the first tapped delay by the amount of the increasing increment after each failure of the first write operations; determine a maximum pass tapped delay by decreasing stepwise, from a maximum tapped delay, the second tapped delay by the amount of the increasing decrement after each failure of the second write operations; and determine an optimized tapped delay between the minimum pass tapped delay and the maximum pass tapped delay.

An embodiment of the present disclosure may provide for a memory system comprising: at least one memory device; and a controller configured to control the at least one memory device to perform first and second write operations of writing a test data thereto. Each of the first and second write operations may be performed according to respective first and second tapped delays between a data signal and a data strobe signal. The controller may be, during the first and second write operations of the at least one memory device, configured to: determine a minimum pass tapped delay by increasing stepwise, from a minimum tapped delay, the first tapped delay by an amount of an increasing increment after each failure of the first write operations; determine a maximum pass tapped delay by decreasing stepwise, from a maximum tapped delay, the second tapped delay by an amount of increasing decrement after each failure of the second write operations; and determine an optimized tapped delay between the minimum pass tapped delay and the maximum pass tapped delay.

BRIEF DESCRIPTION OF THE DRAWINGS

FIG. 16 is a graph illustrating a method of determining the minimum pass tapped delay $P_{min}$ and the maximum pass tapped delay $P_{max}$ for a plurality of memory chips in accordance with an embodiment of the present disclosure.

FIG. 18 is a graph illustrating a method of determining the minimum pass tapped delays $P_{min}$ and the maximum pass tapped delay $P_{max}$ for a plurality of memory chips in accordance with an embodiment of FIGS. 17A and 17B.

FIGS. 19A and 19B are tables describing the writing training operation described with reference to FIG. 18.

FIG. 22 is a flowchart illustrating a method of operating the controller in accordance with an embodiment of the present disclosure.

FIG. 23A is a flowchart illustrating in more detail the step of determining the minimum pass tapped delay of FIG. 22.

FIG. 25 is a flowchart illustrating a write training method according to the embodiment of FIGS. 24A and 24B.

DETAILED DESCRIPTION

Figure 1:
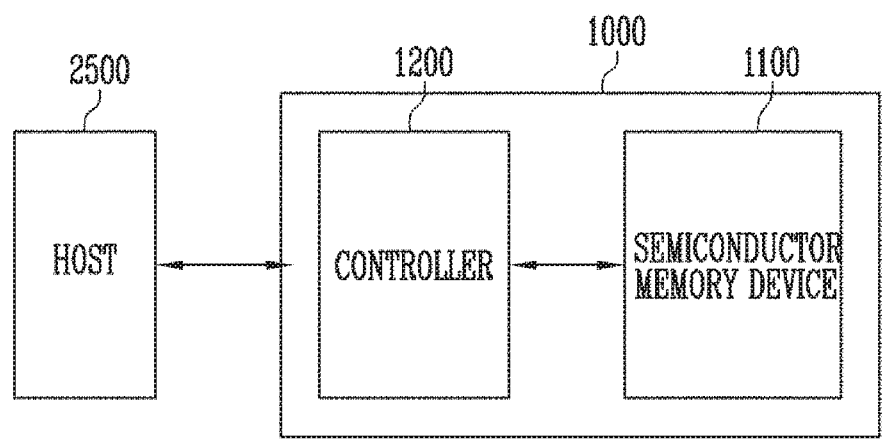
FIG. 1 is a block diagram illustrating a memory system including a controller in accordance with an embodiment of the present disclosure.

Various embodiments will now be described more fully with reference to the accompanying drawings; however, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. Also, reference to "an embodiment" or the like is not necessarily to only one embodiment, and different references to any such phrase are not necessarily to the same embodiment(s).

In the drawing figures, dimensions may be exaggerated for clarity of illustration. It will be understood that when an element is referred to as being "between" two elements, it can be the only element between the two elements, or one or more intervening elements may also be present.

Embodiments are described herein with reference to sectional and schematic illustrations of elements, i.e., components, intermediate structures and devices. As such, variations from the shapes of the elements as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as "first" and "second" may be used to identify various components, but they should not limit the various components. Those terms are only used for the purpose of differentiating a component from other components that have the same or similar names. For example, a first component in one instance may be referred to as a second component in another instance, and vice versa, without departing from the spirit and scope of the present disclosure. Furthermore, "and/or" may include any one of or a combination of the components mentioned.

Furthermore, a singular form may include a plural form and vice versa, unless the context indicates otherwise. Furthermore, "include/comprise" or "including/comprising" used in the specification represents that one or more components, steps, operations, and elements are present or added but does not preclude the presence or addition of one or more other components, steps, operations and/or elements.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through one or more intermediate components. On the other hand, "directly connected/directly coupled" refers to one component directly coupling another component without an intermediate component.

FIG. 1 is a block diagram illustrating a memory system 1000 including a controller 1200 in accordance with an embodiment of the present disclosure.

Referring to FIG. 1, the memory system 1000 may include a semiconductor memory device 1100 configured to store data, and the controller 1200 configured to control the semiconductor memory device 1100 under control of a host 2500.

The host 2500 may communicate with the memory system 1000 using an interface protocol such as a peripheral component interconnect-express (PCI-E) protocol, an advanced technology attachment (ATA) protocol, a serial ATA (SATA) protocol, a parallel ATA (PATA) protocol, or a serial attached SCSI (SAS) protocol. The interface protocol provided for data communication between the host 2500 and the memory system 1000 is not limited to the foregoing examples; any one of interface protocols such as a universal serial bus (USB) protocol, a multi-media card (MMC) protocol, an enhanced small disk interface (ESDI) protocol, and an integrated drive electronics (IDE) protocol may be used.

The semiconductor memory device 1100 may perform a program operation, a read operation, or an erase operation under control of the controller 1200.

The controller 1200 may control the overall operation of the memory system 1000 and data exchange between the host 2500 and the semiconductor memory device 1100. For instance, the controller 1200 may control the memory device 1100 to program or read data in response to a request of the host 2500. In an embodiment, the semiconductor memory device 1100 may include a double data rate synchronous dynamic random access memory (DDR SDRAM), a low power double data rate4 (LPDDR4) SDRAM, a graphics double data rate (GDDR) SDRAM, a low power DDR (LPDDR), a rambus dynamic random access memory (RDRAM), or a flash memory.

Figure 2:
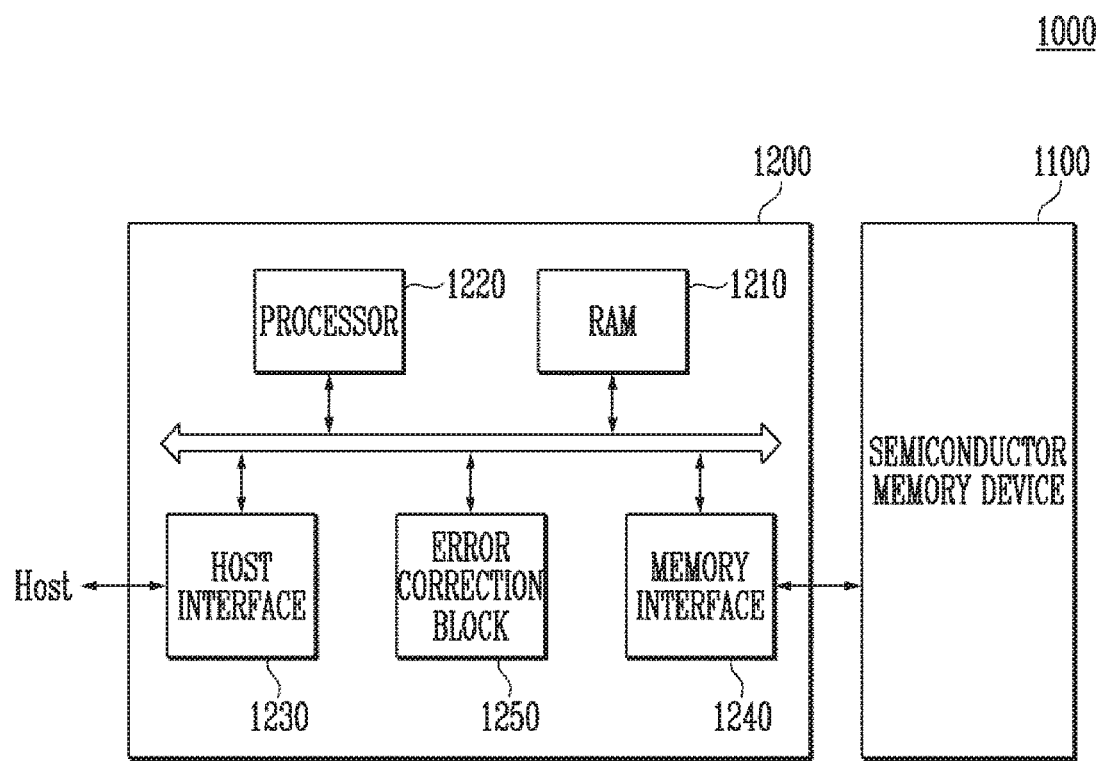
FIG. 2 is a block diagram illustrating a memory system including a controller in accordance with an embodiment of the present disclosure.

FIG. 2 is a block diagram illustrating a memory system 1000 including a controller 1200 in accordance with an embodiment of the present disclosure.

Referring to FIG. 2, in the same manner as that shown in FIG. 1, the memory system 1000 includes a semiconductor memory device 1100 and a controller 1200. The controller 1200 is coupled to the semiconductor memory device 1100 and a host.

The controller 1200 may access the semiconductor memory device 1100 in response to a request from the host. For example, the controller 1200 may control a read operation, a write operation, an erase operation, and a background operation of the semiconductor memory device 1100. The controller 1200 may provide an interface between the semiconductor memory device 1100 and the host. The controller 1200 may drive firmware for controlling the semiconductor memory device 1100.

The controller 1200 may include a random access memory (RAM) 1210, a processor 1220, a host interface 1230, a memory interface 1240, and an error correction block 1250. The RAM 1210 may be used as at least one of an operating memory for the processor 1220, a cache memory between the semiconductor memory device 1100 and the host, and a buffer memory between the semiconductor memory device 1100 and the host. The RAM 1210 may be used as a command queue for temporarily storing commands to be transmitted to the semiconductor memory device 1100.

The processor 1220 may control the overall operation of the controller 1200. Particularly, the processor 1220 may execute the firmware for controlling the semiconductor memory device 1100.

The host interface 1230 may include a protocol for performing data exchange between the host and the controller 1200. In an embodiment, the controller 1200 may communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 may interface with the semiconductor memory device 1100. For example, the memory interface 1240 includes a NAND interface or a NOR interface.

The error correction block 1250 may use an error correcting code (ECC) to detect and correct an error in data received from the semiconductor memory device 1100. The processor 1220 may control the semiconductor memory device 1100 to adjust the read voltage according to an error detection result from the error correction block 1250 and perform re-reading. In an embodiment, the error correction block 1250 may be provided as a component of the controller 1200.

The controller 1200 and the semiconductor memory device 1100 may be integrated into a single semiconductor device. In an embodiment, the controller 1200 and the semiconductor memory device 1100 may be integrated into a single semiconductor device to form a memory card. For example, the controller 1200 and the semiconductor memory device 1100 may be integrated into a single semiconductor device and form a memory card such as a personal computer memory card international association (PCM-CIA), a compact flash card (CF), a smart media card (SM or SMC), a memory stick multimedia card (MMC, RS-MMC, or MMCmicro), a SD card (SD, miniSD, microSD, or SDHC), and a universal flash storage (UFS).

The controller 1200 and the semiconductor memory device 1100 may be integrated into a single semiconductor device to form a solid state drive (SSD). The SSD may include a storage device configured to store data to a semiconductor memory. When the storage device including the controller 1200 and the semiconductor memory device 1100 is used as the SSD, the operating speed of the host coupled to the storage device can be phenomenally improved.

In an embodiment, the storage device including the controller 1200 and the semiconductor memory device 1100 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 1100 and the storage device including the semiconductor memory device 1100 may be embedded in various types of packages such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 3:
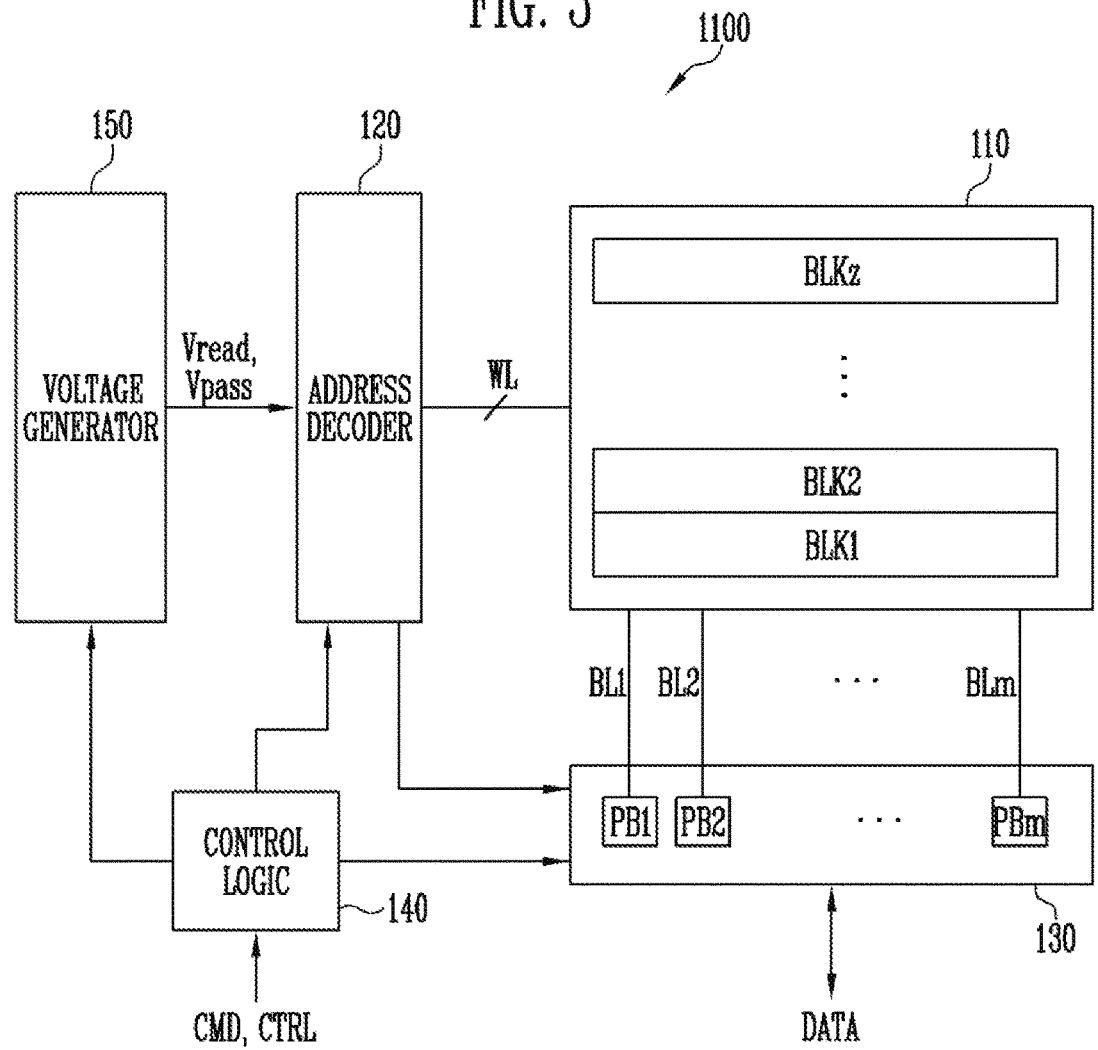
FIG. 3 is a block diagram illustrating a semiconductor memory device 1100 shown in FIG. 1.

FIG. 3 is a block diagram illustrating the semiconductor memory device 1100 shown in FIG. 1.

Referring to FIG. 3, the semiconductor memory device 1100 includes a memory cell array 110, an address decoder 120, a read/write circuit 130, a control logic 140, and a voltage generator 150.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the memory cells may be nonvolatile memory cells and be formed of nonvolatile memory cells having a vertical channel structure. The memory cell array 110 may be formed of a memory cell array having a two-dimensional structure. In an embodiment, the memory cell array 110 may be formed of a memory cell array having a three-dimensional structure. Each of the memory cells included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell (TLC), which stores 3-bit data. In an embodiment, each of the memory cells included in the memory cell array 110 may be a quad-level cell (QLC), which stores 4-bit data. In various embodiments, the memory cell array 110 may include a plurality of memory cells each of which stores 5 or more bits of data.

The address decoder 120, the read/write circuit 130, the control logic 140, and the voltage generator 150 are operated as peripheral circuits for driving the memory cell array 110. The address decoder 120 is coupled to the memory cell array 110 through the word lines WL. The address decoder 120 may operate under control of the control logic 140. The address decoder 120 may receive addresses through an input/output buffer (not shown) provided in the semiconductor memory device 1100.

The address decoder 120 may decode a block address among the received addresses. The address decoder 120 may select at least one memory block based on the decoded block address. When a read voltage application operation is performed during a read operation, the address decoder 120 may apply a read voltage Vread generated from the voltage generator 150, to a selected word line of a selected memory block and apply a pass voltage Vpass to the other unselected word lines. During a program verify operation, the address decoder 120 may apply a verify voltage generated from the voltage generator 150, to a selected word line of a selected memory block, and apply a pass voltage Vpass to the other unselected word lines.

The address decoder 120 may decode a column address among the received addresses. The address decoder 120 may transmit the decoded column address to the read/write circuit 130.

The read or program operation of the semiconductor memory device 1100 is performed on a page basis. Addresses received in a request for a read or program operation may include a block address, a row address and a column address. The address decoder 120 may select one memory block and one word line based on the block address and the row address. The column address may be decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The read/write circuit 130 may be operated as a read circuit during a read operation of the memory cell array 110 and as a write circuit during a write operation. The page buffers PB1 to PBm are coupled to the memory cell array 110 through the bit lines BL1 to BLm. During a read operation or a program verify operation, to sense threshold voltages of the memory cells, the page buffers PB1 to PBm may continuously supply sensing current to the bit lines coupled to the memory cells, and each page buffer may sense, through a sensing node, a change in the amount of flowing current depending on a program state of a corresponding memory cell and latch it as sensing data. The read/write circuit 130 is operated in response to page buffer control signals outputted from the control logic 140.

During a read operation, the read/write circuit 130 may sense data of the memory cells and temporarily store read-out data, and then output data DATA to the input/output buffer (not shown) of the semiconductor memory device 1100. In an embodiment, the read/write circuit 130 may include a column select circuit or the like as well as the page buffers (or page registers).

The control logic 140 is coupled to the address decoder 120, the read/write circuit 130, and the voltage generator 150. The control logic 140 may receive a command CMD and a control signal CTRL through the input/output buffer (not shown) of the semiconductor memory device 1100. The control logic 140 may control the overall operation of the semiconductor memory device 1100 in response to the control signal CTRL. The control logic 140 may output a control signal for controlling the sensing node precharge potential levels of the plurality of page buffers PB1 to PBm. The control logic 140 may control the read/write circuit 130 to perform a read operation of the memory cell array 110.

The voltage generator 150 may generate a read voltage Vread and a pass voltage Vpass during a read operation in response to a control signal outputted from the control logic 140. The voltage generator 150 may include, so as to generate a plurality of voltages having various voltage levels, a plurality of pumping capacitors configured to receive an internal supply voltage, and may generate a plurality of voltages by selectively enabling the plurality of pumping capacitors under control of the control logic 140. As described above, the voltage generator 150 may include a charge pump. The charge pump may include a plurality of pumping capacitors described above. The detailed configuration of the charge pump included in the voltage generator 150 may be designed in various ways, as needed.

The address decoder 120, the read/write circuit 130, and the voltage generator 150 may function as peripheral circuits for performing a read operation, a write operation, or an erase operation on the memory cell array 110. The peripheral circuits may perform a read operation, a write operation, or an erase operation on the memory cell array 110 under control of the control logic 140.

Figure 4:
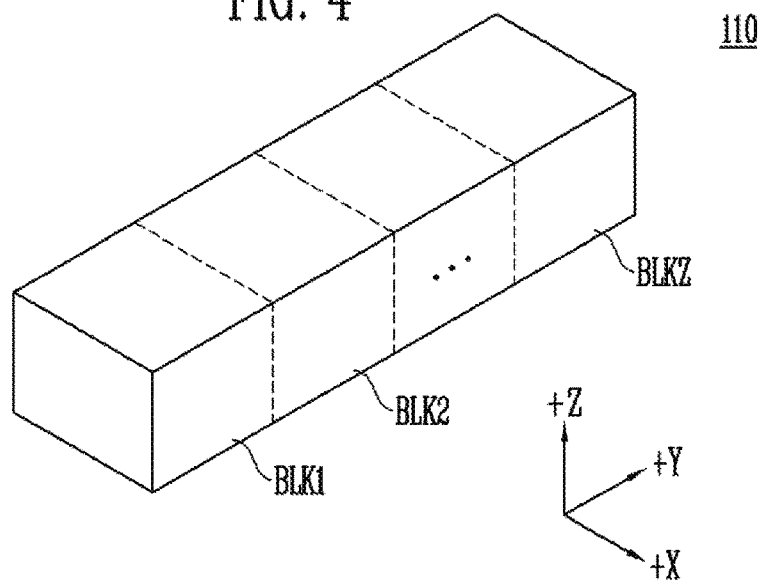
FIG. 4 is a diagram illustrating an example of a memory cell array of FIG. 3.

FIG. 4 is a diagram illustrating an example of the memory cell array 110 of FIG. 3.

Referring to FIG. 4, the memory cell array 110 may include a plurality of memory blocks BLK1 to BLKz. Each memory block may have a three-dimensional structure. Each memory block may include a plurality of memory cells stacked on a substrate. The memory cells are arranged in a +X direction, a +Y direction, and a +Z direction. The structure of each memory block will be described in more detail with reference to FIGS. 5 and 6.

Figure 5:
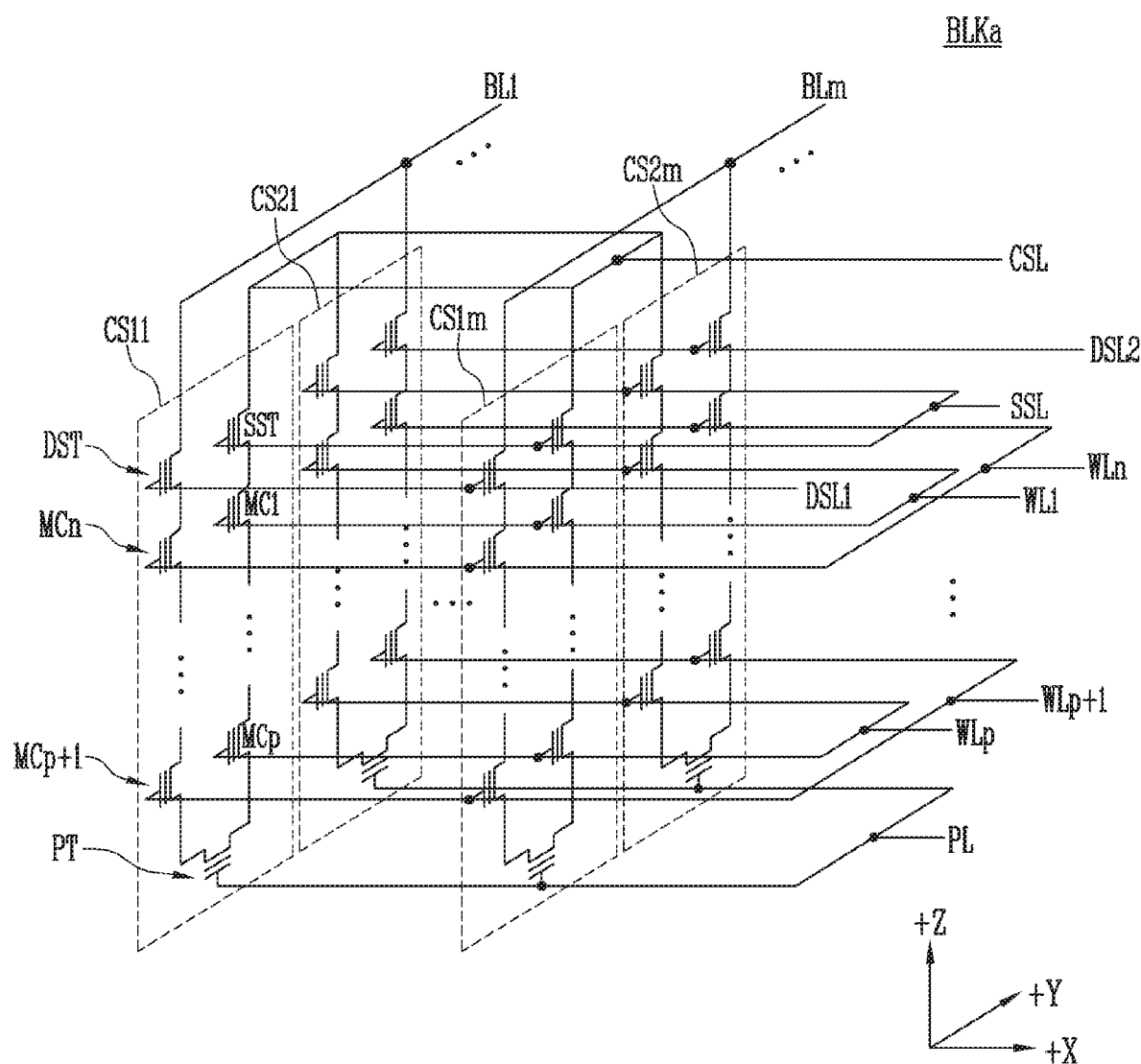
FIG. 5 is a circuit diagram illustrating any one memory block BLKa, of memory blocks BLK1 to BLKz of FIG. 4, in accordance with an embodiment of the present disclosure.

FIG. 5 is a circuit diagram illustrating any one memory block BLKa of memory blocks BLK1 to BLKz of FIG. 4 in accordance with an embodiment of the present disclosure.

Referring to FIG. 5, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e., the +X direction). In FIG. 5, two cell strings are illustrated as being arranged in a column direction (i.e., the +Y direction). However, this illustration is for clarity; it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCp.

In an embodiment, source select transistors of cell strings arranged in the same row are coupled to a source select line extending in a row direction, and source select transistors of cell strings arranged in different rows are coupled to different source select lines. In FIG. 5, source select transistors of the cell strings CS11 to CS1m in a first row are coupled to a first source select line SSL1. Source select transistors of the cell strings CS21 to CS2m in a second row are coupled to a second source select line SSL2.

In an embodiment, the source select transistors of the cell strings CS11 to CS1m and CS21 to CS2m may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are successively arranged in a direction opposite to the +Z direction and are coupled in series between the source select transistor SST and the pipe transistor PT. The p+1-th to n-th memory cells MCp+1 to MCn are successively arranged in the +Z direction and are coupled in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn of each cell string are coupled to first to n-th word lines WL1 to WLn, respectively.

Respective gates of the pipe transistors PT of the cell strings are coupled to a pipeline PL.

The drain select transistor DST of each cell string is coupled between the corresponding bit line and the memory cells MCp+1 to MCn. The cell strings arranged in the row direction are coupled to drain select lines extending in the row direction. Drain select transistors of the cell strings CS11 to CS1m in the first row are coupled to a first drain select line DSL1. Drain select transistors of the cell strings CS21 to CS2m in the second row are coupled to a second drain select line DSL2.

Cell strings arranged in the column direction may be coupled to bit lines extending in the column direction. In FIG. 5, cell strings CS11 and CS21 in a first column are coupled to a first bit line BL1. Cell strings CS1m and CS2m in an m-th column are coupled to an m-th bit line BLm.

Memory cells coupled to the same word line in cell strings arranged in the row direction form a single page. For example, memory cells coupled to the first word line WL1, among the cell strings CS11 to CS1m in the first row, form a single page. Memory cells coupled to the first word line WL1, among the cell strings CS21 to CS2m in the second row, form another single page. When any one of the drain select lines DSL1 and DSL2 is selected, corresponding cell strings arranged in the direction of a single row may be selected. When any one of the word lines WL1 to WLn is selected, a corresponding single page may be selected from the selected cell strings.

In an embodiment, even bit lines and odd bit lines may be provided in lieu of the first to m-th bit lines BL1 to BLm. Even-numbered cell strings of the cell strings CS11 to CS1m or CS21 to CS2m arranged in the row direction may be coupled to respective even bit lines. Odd-numbered cell strings of the cell strings CS11 to CS1m or CS21 to CS2m arranged in the row direction may be coupled to respective odd bit lines.

In an embodiment, at least one of the first to n-th memory cells MC1 to MCn may be used as a dummy memory cell. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. As the number of dummy memory cells is increased, the reliability in operation of the memory block BLKa may be increased, while the size of the memory block BLKa may be increased. As the number of dummy memory cells is reduced, the size of the memory block BLKa may be reduced, but the reliability in operation of the memory block BLKa may be reduced.

To efficiently control the dummy memory cell(s), each may have a required threshold voltage. Before or after an erase operation on the memory block BLKa is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 6:
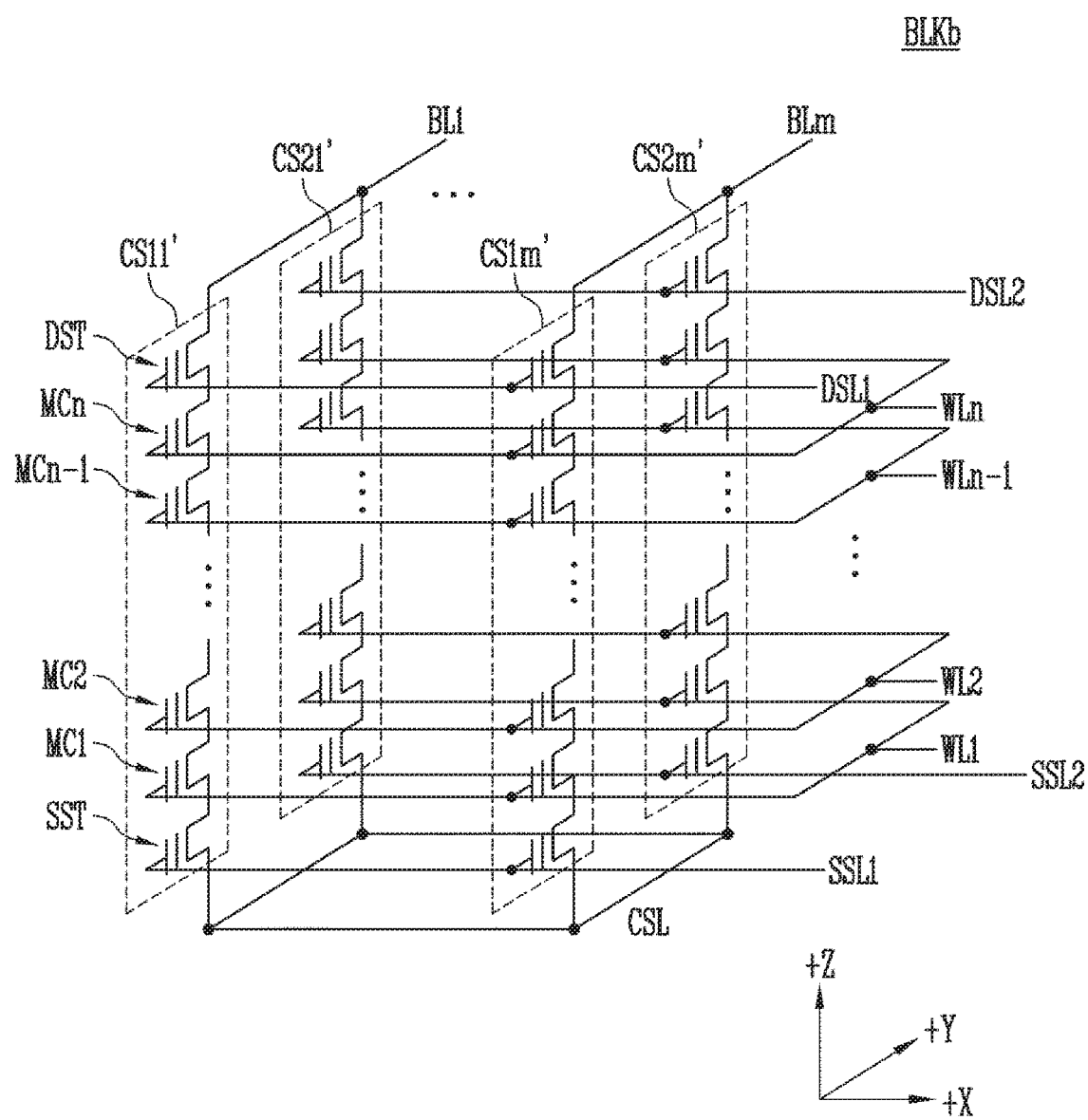
FIG. 6 is a circuit diagram illustrating any one memory block BLKb, of the memory blocks BLK1 to BLKz of FIG. 4, in accordance with an embodiment of the present disclosure.

FIG. 6 is a circuit diagram illustrating any one memory block BLKb of the memory blocks BLK1 to BLKz of FIG. 4 in accordance with an embodiment of the present disclosure.

Referring to FIG. 6, the memory block BLKb may include a plurality of cell strings CS11' to CS1$m$' and CS21' to CS2$m$'. Each of the cell strings CS11' to CS1$m$' and CS21' to CS2$m$' extends in the +Z direction. Each of the cell strings CS11' to CS1$m$' and CS21' to CS2$m$' may include at least one source select transistor SST, first to n-th memory cells MC1 to MCn, and at least one drain select transistor DST which are stacked on a substrate (not shown) provided in a lower portion of the memory block BLK1'.

The source select transistor SST of each cell string is coupled between the common source line CSL and the memory cells MC1 to MCn. The source select transistors of cell strings arranged in the same row are coupled to the same source select line. Source select transistors of the cell strings CS11' to CS1$m$' arranged in a first row may be coupled to a first source select line SSL1. Source select transistors of the cell strings CS21' to CS2$m$' arranged in a second row may be coupled to a second source select line SSL2. In an embodiment, source select transistors of the cell strings CS11' to CS1$m$' and CS21' to CS2$m$' may be coupled in common to a single source select line.

The first to n-th memory cells MC1 to MCn in each cell string are coupled in series between the source select transistor SST and the drain select transistor DST. Gates of the first to n-th memory cells MC1 to MCn are respectively coupled to first to n-th word lines WL1 to WLn.

The drain select transistor DST of each cell string is coupled between the corresponding bit line and the memory cells MC1 to MCn. Drain select transistors of cell strings arranged in the row direction may be coupled to drain select lines extending in the row direction. Drain select transistors of the cell strings CS11' to CS1$m$' in the first row are coupled to a first drain select line DSL1. Drain select transistors of the cell strings CS21' to CS2$m$' in the second row may be coupled to a second drain select line DSL2.

Consequentially, the memory block BLKb of FIG. 6 may have an equivalent circuit similar to that of the memory block BLKa of FIG. 5 except that a pipe transistor PT is excluded from each cell string.

In an embodiment, even bit lines and odd bit lines may be provided in lieu of the first to m-th bit lines BL1 to BLm. Even-numbered cell strings among the cell strings CS11' to CS1$m$' or CS21' to CS2$m$' arranged in the row direction may be coupled to the respective even bit lines, and odd-numbered cell strings among the cell strings CS11' to CS1$m$' or CS21' to CS2$m$' arranged in the row direction may be coupled to the respective odd bit lines.

In an embodiment, at least one of the first to n-th memory cells MC1 to MCn may be used as a dummy memory cell. For example, one or more dummy memory cells may be provided to reduce an electric field between the source select transistor SST and the memory cells MC1 to MCn. Alternatively, one or more dummy memory cells may be provided to reduce an electric field between the drain select transistor DST and the memory cells MC1 to MCn. As the number of dummy memory cells is increased, the reliability in operation of the memory block BLKb may be increased, while the size of the memory block BLKb may be increased. As the number of dummy memory cells is reduced, the size of the memory block BLKb may be reduced, but the reliability in operation of the memory block BLKb may be reduced.

To efficiently control the dummy memory cell(s), each may have a required threshold voltage. Before or after an erase operation on the memory block BLKb is performed, program operations may be performed on all or some of the dummy memory cells. In the case where an erase operation is performed after a program operation has been performed, the dummy memory cells may have required threshold voltages by controlling voltages to be applied to the dummy word lines coupled to the respective dummy memory cells.

Figure 7:
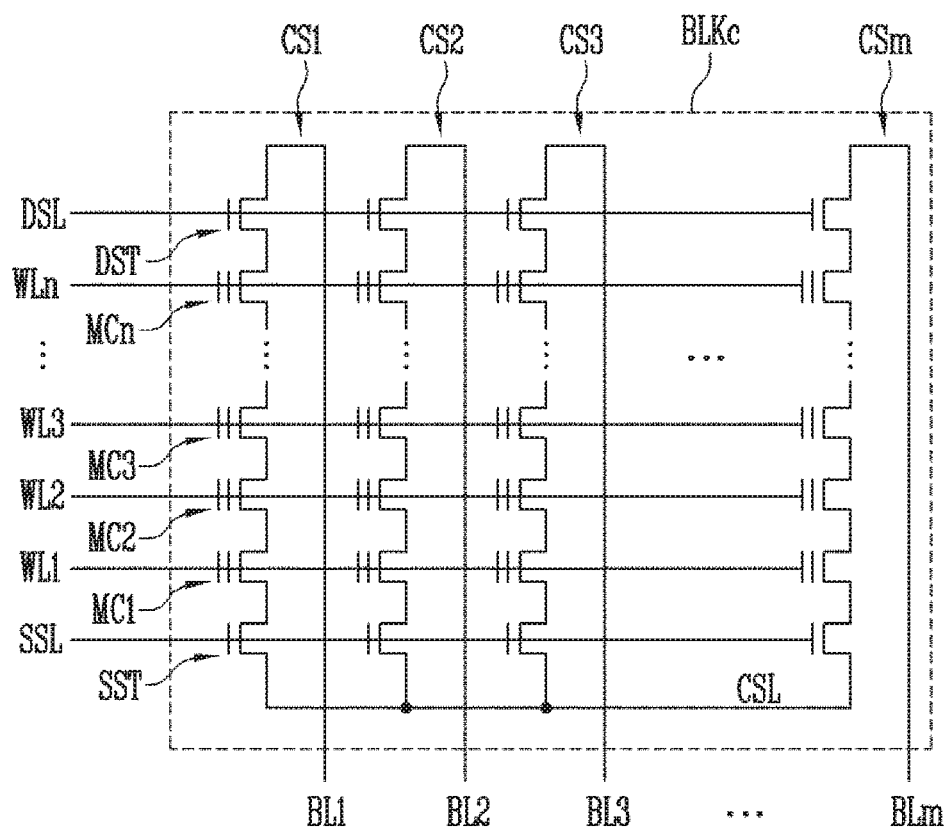
FIG. 7 is a circuit diagram illustrating any one memory block BLKc, of the memory blocks BLK1 to BLKz in the memory cell array 110 of FIG. 3, in accordance with an embodiment of the present disclosure.

FIG. 7 is a circuit diagram illustrating any one memory block BLKc of the memory blocks BLK1 to BLKz in the memory cell array 110 of FIG. 3 in accordance with an embodiment of the present disclosure.

Referring to FIG. 7, the memory block BLKc includes a plurality of cell strings CS1 to CSm. The plurality of cell strings CS1 to CSm may be respectively coupled to a plurality of bit lines BL1 to BLm. Each of the cell strings CS1 to CSm includes at least one source select transistor SST, first to n-th memory cells MC1 to MCn, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between the common source line CSL and the memory cells MC1 to MCn.

The first to n-th memory cells MC1 to MCn in each cell string are coupled between the source select transistor SST and the drain select transistor DST.

The drain select transistor DST of each cell string is coupled between the corresponding bit line and the memory cells MC1 to MCn.

Memory cells coupled to the same word line may form a single page. The cell strings CS1 to CSm may be selected by selecting the drain select line DSL. When any one of the word lines WL1 to WLn is selected, a corresponding single page may be selected from among the selected cell strings.

In an embodiment, even bit lines and odd bit lines may be provided in lieu of the first to m-th bit lines BL1 to BLm. Even-numbered cell strings of the cell strings CS1 to CSm may be coupled to the respective even bit lines, and odd-numbered cell strings may be coupled to the respective odd bit lines.

Figure 8:
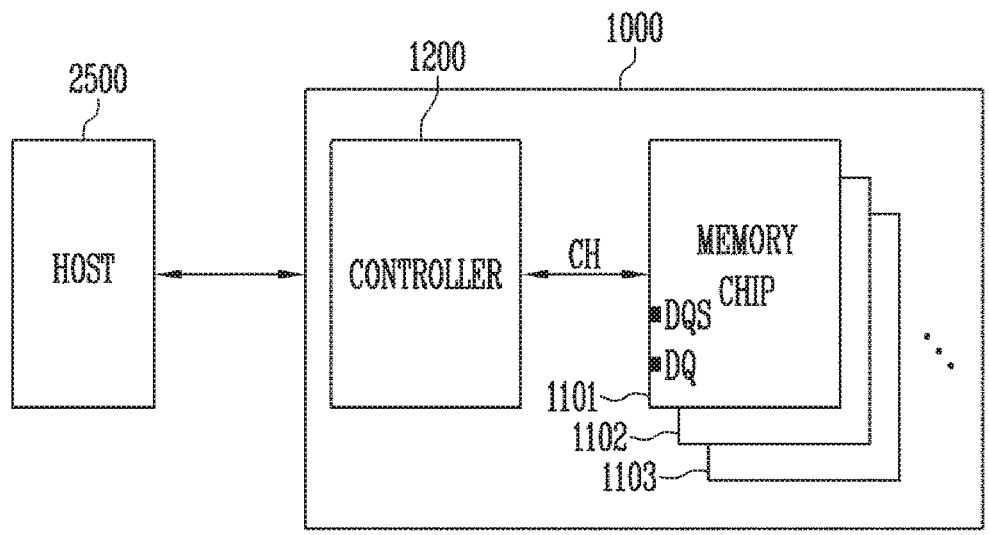
FIG. 8 is a diagram illustrating a controller for controlling the operation of a plurality of memory chip in accordance with an embodiment of the present disclosure.

FIG. 8 is a diagram illustrating the controller 1200 for controlling the operation of a plurality of memory chip in accordance with an embodiment of the present disclosure.

Referring to FIG. 8, the memory system 1000 includes a plurality of memory chips 1101, 1102, and 1103, and the controller 1200. The host 2500 communicates with the controller 1200. Each of the memory chips 1101, 1102, and 1103 may be the semiconductor memory device 1100 shown in FIGS. 1 and 2. The plurality of memory chips may be coupled to the controller 1200 by sharing a single channel CH. Each memory chip may include a strobe terminal DQS and a data input/output terminal DQ. Although not shown in detail in FIG. 8, the data input/output terminal DQ may include eight physical terminals.

Figure 9:
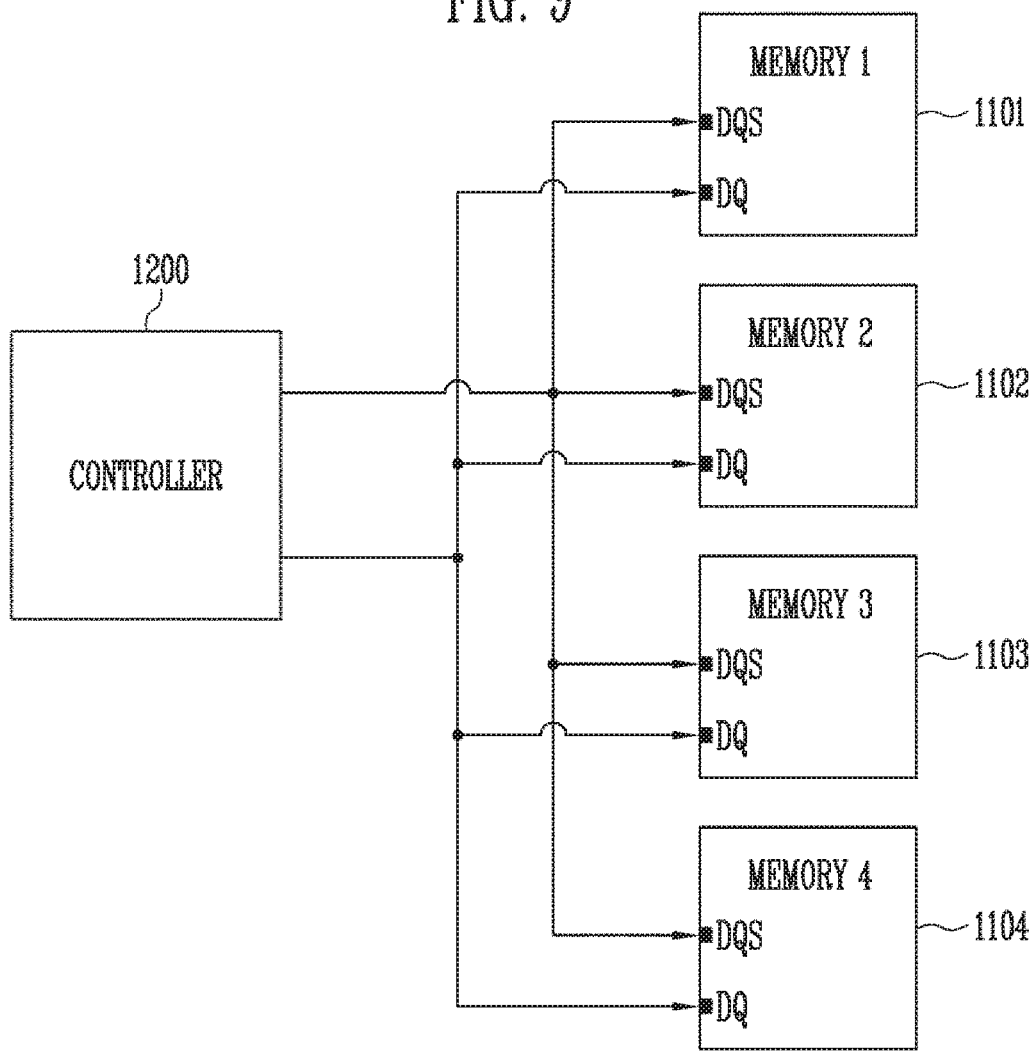
FIG. 9 is a block diagram schematically illustrating a connection relationship between the controller and the plurality of memory chips of FIG. 8.

FIG. 9 is a block diagram schematically illustrating a connection relationship between the controller 1200 and each of the plurality of memory chips of FIG. 8. FIG. 9 illustrates an embodiment in which four memory chips 1101, 1102, 1103, and 1104 are coupled to the controller 1200 through a single channel.

Referring to FIG. 9, strobe terminals DQS of the plurality of memory chips 1101, 1102, 1103, and 1104 are connected to the controller 1200 through a single data strobe line. Furthermore, data input/output terminals DQ of the plurality of memory chips 1101, 1102, 1103, and 1104 are connected to the controller 1200 through a single data line. In this structure, the connection of the plurality of memory chips 1101, 1102, 1103, and 1104 to the controller 1200 is defined as "connection by sharing a channel."

Figure 10:
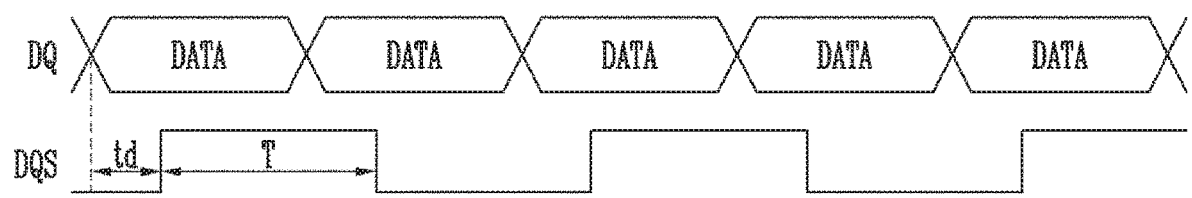
FIG. 10 is a timing diagram illustrating a signal which is transmitted between a controller 1200 and a memory chip.

FIG. 10 is a timing diagram illustrating a strobe signal and data which are transmitted between the controller 1200 and a memory chip.

Referring to FIG. 10, a strobe signal is applied through a strobe terminal DQS. Furthermore, data is transmitted through a data input/output terminal DQ. As shown in FIG. 10, the strobe signal (DQS) may be a periodic signal having a period T. In an embodiment, data may be received through the data input/output terminal DQ at an edge of the strobe signal. More generally, data may be received through the data input/output terminal DQ at a rising edge or a falling edge of the strobe signal. To reliably receive the data, the output of the strobe signal (DQS) may be delayed by an amount referred to a tapped delay td. The optimum value of the tapped delay td may vary in memory chips.

Figure 11:
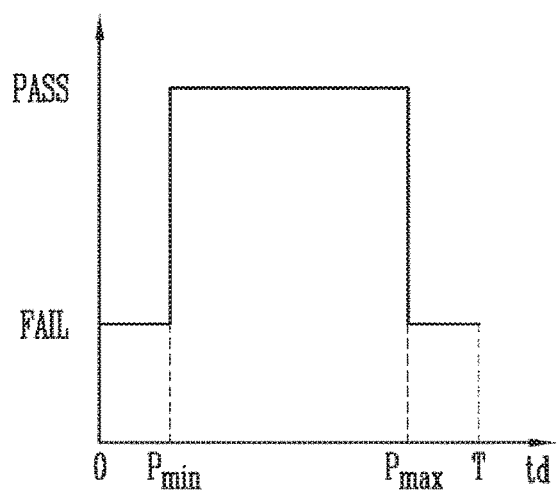
FIG. 11 is a graph showing pass and fail of a write operation as a function of an amount of tapped delay td.

FIG. 11 is a graph showing pass and fail of a write operation as a function of a tapped delay td. Referring to FIG. 10, since data is received at an edge of the strobe signal DQS, the write operation may fail if the tapped delay is excessively small or large. Referring to FIG. 11, if the tapped delay td is less than a minimum pass tapped delay $P_{min}$ or greater than a maximum pass tapped delay $P_{max}$, the write operation may fail. If the tapped delay td is greater than the minimum pass tapped delay $P_{min}$ or less than the maximum pass tapped delay $P_{max}$, the write operation may pass.

Figure 12:
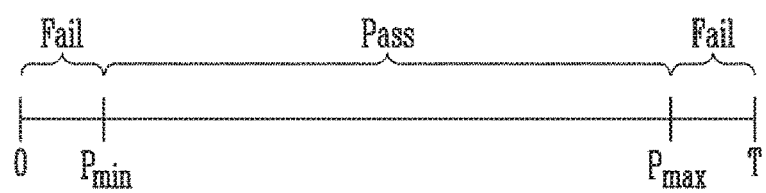
FIG. 12 is a diagram schematically showing another representation of the graph of FIG. 11.

FIG. 12 is a diagram schematically showing another representation of the graph of FIG. 11.

As shown in FIG. 12, when the tapped delay td is in a range $[0:P_{min}]$ or a range $[P_{max}:T]$, the write operation fails, and when it is in a range $[P_{min}:P_{max}]$, the write operation passes. Therefore, it is important to determine the minimum pass tapped delay $P_{min}$ and the maximum pass tapped delay $P_{max}$. If the minimum pass tapped delay $P_{min}$ and the maximum pass tapped delay $P_{max}$ are determined, the optimum tapped delay may be determined based on the determined minimum and maximum pass tapped delays $P_{min}$ and $P_{max}$. For example, the arithmetic mean of the minimum pass tapped delay $P_{min}$ and the maximum pass tapped delay $P_{max}$ may be determined to be the optimum tapped delay.

Figure 13A:
FIGS. 13A and 13B are block diagrams illustrating steps of a write training operation.
Figure 13B:
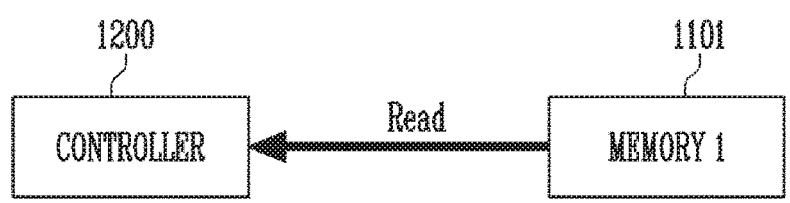

FIGS. 13A and 13B are block diagrams illustrating steps of a write training operation. For ease of description and illustration, a method of performing the write training operation will be described with respect to only a first memory chip 1101 (MEMORY 1). However, it is to be understood that the method is equally applicable to any of the other memory chips.

To perform the write training operation, as shown in FIG. 13A, the controller 1200 first transmits write data to the first memory chip 1101 and performs a write operation (Write). In this case, a strobe signal DQS may be transmitted with the minimum tapped delay.

Thereafter, as shown in FIG. 13B, the controller 1200 receives data from the first memory chip 1101. This operation may be performed in such a way as to read the data written to the first memory chip 1101 through the write operation of FIG. 13A. If the read operation fails, the controller 1200 may change the tapped delay and then re-perform the write operation described with reference to FIG. 13A.

Figure 14:
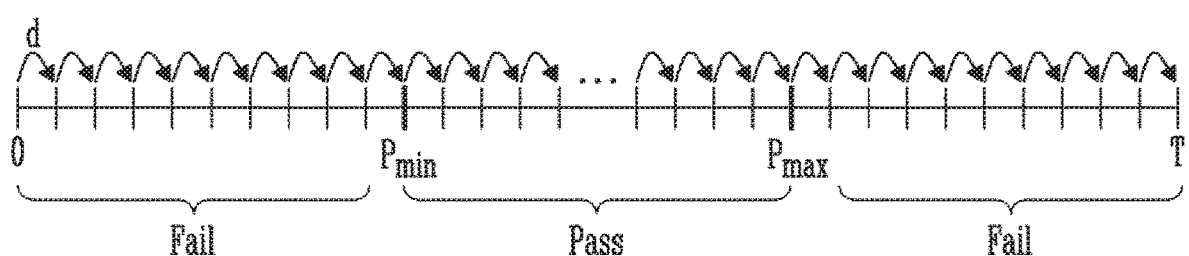
FIG. 14 a graph illustrating a general method of determining a minimum pass tapped delay $P_{min}$ and a maximum pass tapped delay $P_{max}$.

FIG. 14 is a graph illustrating a general method of determining the minimum pass tapped delay $P_{min}$ and the maximum pass tapped delay $P_{max}$.

As shown in FIGS. 13A and 13B, the controller 1200 writes data to the first memory chip 1101 and reads the written data. As shown in FIG. 14, generally, the controller 1200 repeatedly performs the write and the read operations described with reference to FIGS. 13A and 13B while changing the tapped delay td by an amount corresponding to a delay value d. After the tapped delay td is initialized to "0", the write and the read operations may be performed while increasing the tapped delay td by the delay value d. The delay value d may be the minimum unit time of the tapped delay.

When the tapped delay td is comparatively small, a corresponding write operation may fail, resulting in a fail signal being generated. When the tapped delay td reaches a first specific value, a corresponding write operation may be successful, in which case a pass signal may be generated. The minimum among the tapped delays td capable of supporting successful write operations, may be the minimum pass tapped delay $P_{min}$. Subsequently, during a subsequent section in which td is greater than the first specific value, corresponding write operations may be successful. When the tapped delay td reaches another, second specific value, a corresponding write operation may fail again. The maximum among the tapped delays td capable of supporting successful write operations, may be the maximum pass tapped delay $P_{max}$.

As such, in the typical method of determining whether the write operation has passed or failed in the entire period T with respect to a single memory chip by changing the tapped delay by a unit amount having a delay value d, the data write and the read operations are repeatedly performed by the number of changed delay values. Hence, the time it takes to perform the write training operation is increased.

In accordance with the present disclosure, the minimum pass tapped delay and the maximum pass tapped delay are determined while changing the tapped delay by an increasing offset amount. Consequently, the time it takes to determine the minimum pass tapped delay and the maximum pass tapped delay for a single memory chip may be reduced. As a result, the time required to perform write training operations on a plurality of memory chips may be reduced.

Figure 15A:
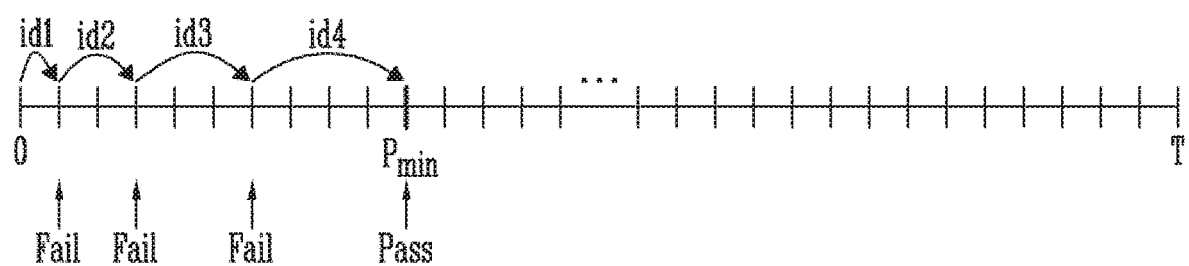
FIGS. 15A and 15B are graphs illustrating a method of determining a minimum pass tapped delay $P_{min}$ and a maximum pass tapped delay $P_{max}$ in accordance with an embodiment of the present disclosure.
Figure 15B:
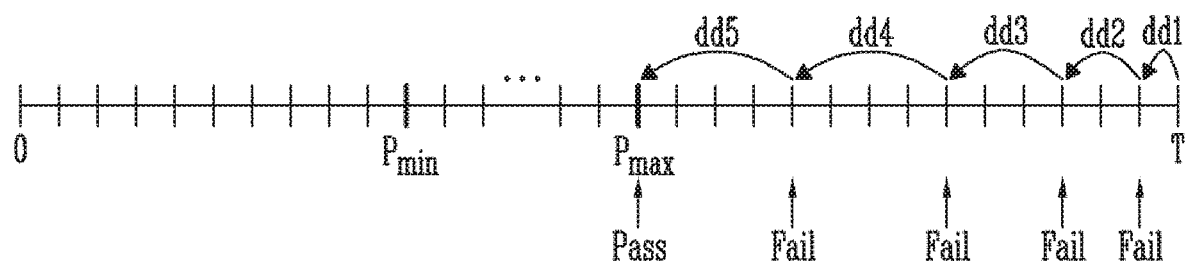

FIGS. 15A and 15B are graphs illustrating a method of determining the minimum pass tapped delay $P_{min}$ and the maximum pass tapped delay $P_{max}$ in accordance with an embodiment of the present disclosure.

Referring to FIG. 15A, the minimum pass tapped delay $P_{min}$ may be determined while changing the tapped delay by an increasing offset amount. Referring to FIG. 15A, both the tapped delay td and a first offset for determining the minimum pass tapped delay $P_{min}$ may be initialized to "0". After the tapped delay td of "0" is applied to the strobe signal DQS, training data is written, and the written training data is read.

If the read operation has failed as a result of applying the tapped delay td of "0", the first offset is increased to a first value id1, and the tapped delay td is increased by an amount of the first offset having the first value id1. The first value id1 may correspond to the delay value d shown in FIG. 14, and may be the minimum unit time of the tapped delay.

As shown in FIG. 15A, if the read operation has failed as a result of applying the tapped delay td increased by the first value id1, the first offset is further increased by a second value id2, and the tapped delay td is increased by an amount of the first offset having a sum of the existing first value id1 and the second value id2. That is, in this case, the tapped delay td is id1+id2. The second value id2 may be two times the first value id1.

As shown in FIG. 15A, if the read operation has failed as a result of applying the tapped delay td increased by the sum of the first and second values id1 and id2, the first offset is further increased by a third value id3, and the tapped delay td is increased by an amount of the first offset having a sum of the existing value (id1+id2) and the third value (id3). That is, in this case, the tapped delay td becomes id1+id2+id3. The third value id3 may be three times the first value id1.

As shown in FIG. 15A, if the read operation has failed as a result of applying the tapped delay td increased by the sum of the first to third values id1 to id3, the first offset is further increased by a fourth value id4, and the tapped delay td is increased by an amount of the first offset having a sum of the existing value (id1+id2+id3) and the fourth value (id4). That is, in this case, the tapped delay td becomes id1+id2+id3+id4. The fourth value id4 may be four times the first value id1.

As shown in FIG. 15A, if the read operation has passed as a result of applying the tapped delay td increased by the sum of the first to fourth values id1 to id4, the corresponding tapped delay td is determined to be the minimum pass tapped delay $P_{min}$.

Thereafter, according to a method shown in FIG. 15B, the maximum pass tapped delay $P_{max}$ may be determined while changing the tapped delay by an amount of an increasing offset. Referring to FIG. 15B, the tapped delay td may be initialized to "T" that is the maximum value, and a second offset for determining the maximum pass tapped delay $P_{max}$ may be initialized to "0". After the tapped delay td of "T" is applied to the strobe signal DQS, training data is written, and the written training data is read.

If the read operation has failed as a result of applying the tapped delay td of "T", the second offset is increased by a first value dd1, and the tapped delay td is reduced by an amount of the second offset having the first value dd1 (i.e., td=T−dd1). The first value dd1 may correspond to the delay value d shown in FIG. 14, and may be the minimum unit time of the tapped delay.

As shown in FIG. 15B, if the read operation has failed as a result of applying the tapped delay td reduced by an amount of the first value dd1, the second offset is increased by a second value dd2, and the tapped delay td is reduced by an amount of the second offset having a sum of the existing first value dd1 and the second value dd2. That is, in this case, the tapped delay td becomes T−dd1−dd2. The second value dd2 may be two times the first value dd1.

As shown in FIG. 15B, if the read operation has failed as a result of applying the tapped delay td reduced by the sum of the first and second values dd1 and dd2, the second offset is further increased by a third value dd3, and the tapped delay td is reduced by an amount of the second offset having a sum of the existing first and second values dd1 and dd2 and the third value dd3. That is, in this case, the tapped delay td becomes T−dd1−dd2−dd3. The third value dd3 may be three times the first value dd1.

As a result of repeatedly performing the above-mentioned process, as shown in FIG. 15B, if the read operation has passed after the tapped delay td, reduced by the sum of the first to fifth values dd1 to dd5, has been applied, that tapped delay td is determined to be the maximum pass tapped delay $P_{max}$. In this way, the minimum pass tapped delay $P_{min}$ and the maximum pass tapped delay $P_{max}$ for the single memory chip may be determined. Compared to the typical method shown in FIG. 14, in the method in accordance with an embodiment of the present disclosure, the time it takes to determine the minimum pass tapped delay $P_{min}$ and the maximum pass tapped delay $P_{max}$ for a single memory chip may be reduced. Consequently, the time required to perform write training operations on a plurality of memory chips may be markedly reduced.

FIG. 16 is a graph illustrating a method of determining a minimum pass tapped delay $PF_{min}$ and a maximum pass tapped delay $PF_{max}$ for a plurality of memory chips in accordance with an embodiment of the present disclosure.

Referring to FIG. 16, a minimum pass tapped delay $P1_{min}$ and a maximum pass tapped delay $P1_{max}$ for a first memory chip 1101 of N memory chips 1101, 1102, 1103, ..., 110N are determined. During this process, the method described with reference to FIGS. 15A and 15B is used.

After the minimum pass tapped delay $P1_{min}$ and the maximum pass tapped delay $P1_{max}$ for the first memory chip 1101 have been determined, a minimum pass tapped delay $P2_{min}$ and a maximum pass tapped delay $P2_{max}$ for a second memory chip 1102 are determined. Thereafter, a minimum pass tapped delay $P3_{min}$ and a maximum pass tapped delay $P3_{max}$ for a third memory chip 1103 are determined. In this way, the operations of determining the minimum and maximum pass tapped delays may be successively performed until a minimum pass tapped delay $PN_{min}$ and a maximum pass tapped delay $PN_{max}$ for an N-th memory chip 110N are determined.

If the minimum pass tapped delays $P1_{min}$, $P2_{min}$, $P3_{min}$, ..., $PN_{min}$ and the maximum pass tapped delays $P1_{max}$, $P2_{max}$, $P3_{max}$, ..., $PN_{max}$ for the first to N-th memory chips 1101, 1102, 1103, ..., 110N are determined, a final minimum pass tapped delay $PF_{min}$ and a final maximum pass tapped delay $PF_{max}$ which may be commonly applied to the N memory chips 1101, 1102, 1103, ..., 110N are determined based on the minimum pass tapped delays $P1_{min}$, $P2_{min}$, $P3_{min}$, ..., $PN_{min}$ and the maximum pass tapped delays $P1_{max}$, $P2_{max}$, $P3_{max}$, ..., $PN_{max}$. In the embodiment illustrated in FIG. 16, the final minimum pass tapped delay $PF_{min}$ may be determined to be the third minimum pass tapped delay $P3_{min}$ that is the maximum value of the minimum pass tapped delays $P1_{min}$, $P2_{min}$, $P3_{min}$, ..., $PN_{min}$. Furthermore, the final maximum pass tapped delay $PF_{max}$ may be determined to be the first maximum pass tapped delay $P1_{max}$ that is the minimum value of the maximum pass tapped delays $P1_{max}$, $P2_{max}$, $P3_{max}$, ..., $PN_{max}$.

If the final minimum pass tapped delay $PF_{min}$ and the final maximum pass tapped delay $PF_{max}$ are determined, an optimum tapped delay td to be applied in common to the first to N-th memory chips 1101, 1102, 1103, ..., 110N may be determined based on the final minimum pass tapped delay $PF_{min}$ and the final maximum pass tapped delay $PF_{max}$. For example, in the embodiment illustrated in FIG. 16, the optimum tapped delay td may be determined to be the arithmetic mean of the final minimum pass tapped delay $PF_{min}$ and the final maximum pass tapped delay $PF_{max}$.

Figure 17A:
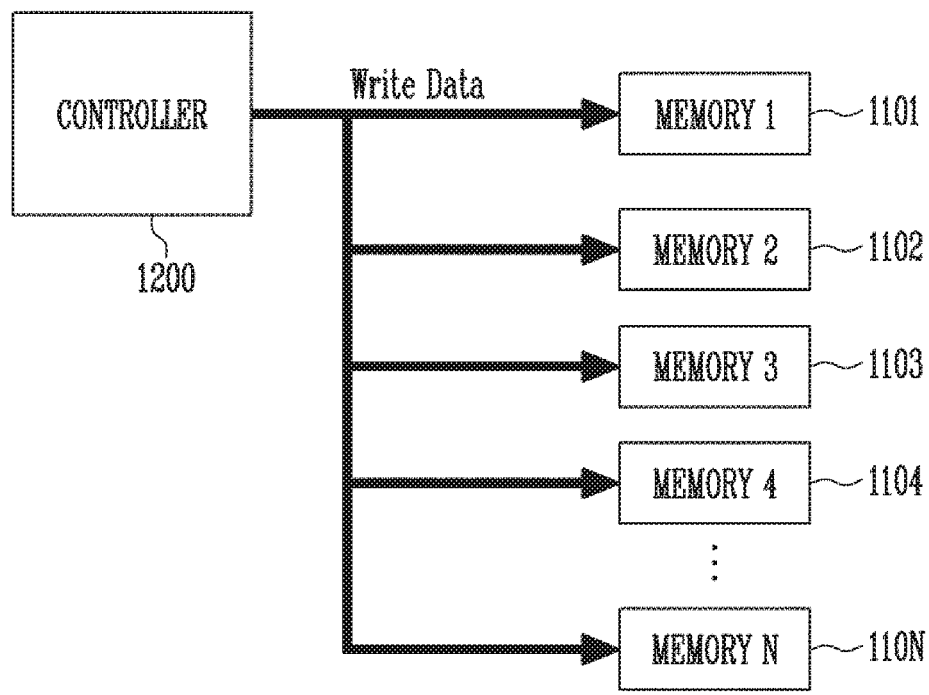
FIGS. 17A and 17B are block diagrams illustrating partial steps of a write training operation in accordance with an embodiment of the present disclosure.
Figure 17B:
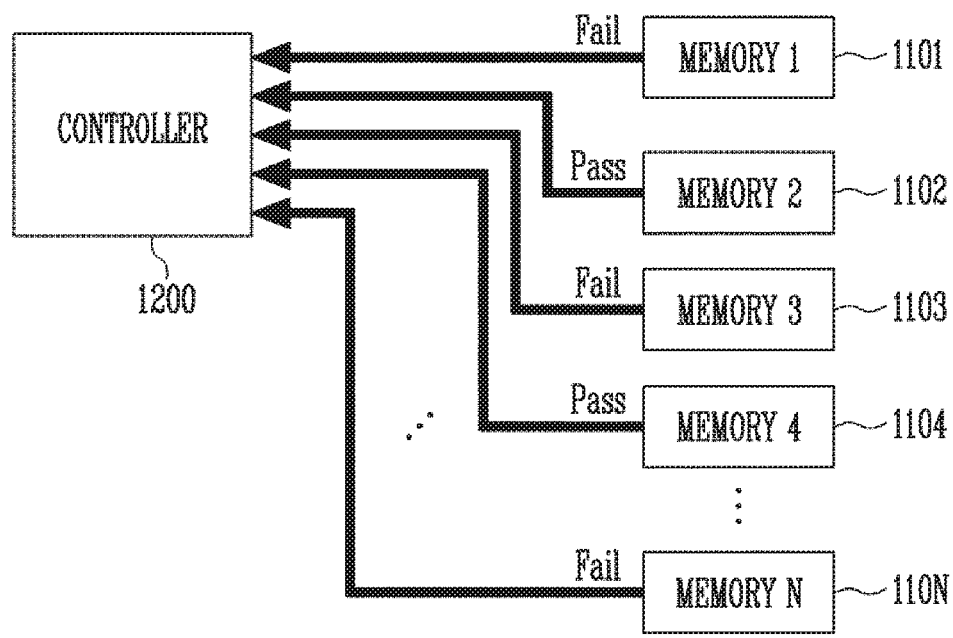

FIGS. 17A and 17B are block diagrams illustrating steps of a write training operation in accordance with an embodiment of the present disclosure.

Referring to FIG. 17A, the controller 1200 may simultaneously transmit write data to first to N-th memory chips 1101, 1102, 1103, . . . , 110N. As described with reference to FIG. 9, if the memory chips share a single channel, the same write data may be transmitted to the memory chips. Here, the controller 1200 enables all of the first to N-th memory chips 1101, 1102, 1103, . . . , 110N so that the write data is inputted to respective data input/output terminals DQ of the memory chips. Furthermore, the controller 1200 may apply a strobe signal to respective strobe terminals DQS of the first to N-th memory chips 1101, 1102, 1103, . . . , 110N and control the first to N-th memory chips 1101, 1102, 1103, . . . , 110N such that the received write data is programmed to the first to N-th memory chips 1101, 1102, 1103, . . . , 110N. In this case, the time it takes to perform the write operation may be reduced, compared to the case where write data is individually inputted to each of the memory chips.

After the write data has been programmed to all of the first to N-th memory chips 1101, 1102, 1103, . . . , 110N, as shown in FIG. 17B, data written to the respective memory chips is sequentially read so as to determine whether the program operation has been correctly performed on each memory chip in response to the strobe signal DQS applied at the step described with reference to FIG. 17A. Read operations on some memory chips 1101, 1103, and 110N may have failed, and read operations on some memory chips 1102 and 1104 may have passed. If a memory chip the read operation of which has failed is present, the corresponding strobe signal may not be used. Hence, in this case, the tapped delay of the strobe signal is required to be changed.

FIG. 18 is a graph illustrating a method of determining a minimum pass tapped delays $P_{min}$ and a maximum pass tapped delay $P_{max}$ for a plurality of memory chips in accordance with an embodiment of the present disclosure.

Referring to FIG. 18, the minimum pass tapped delay $P_{min}$ may be determined while changing the tapped delay by an increasing offset. Referring to a left portion of the graph shown in FIG. 18, both the tapped delay td and a first offset for determining the minimum pass tapped delay $P_{min}$ may be initialized to "0". The tapped delay td of "O" is applied to the strobe signal, and training data, i.e., write data, may be simultaneously written to the first to N-th memory chips 1101, 1102, 1103, . . . , 110N (refer to FIG. 17A). Thereafter, the training data written to the first to N-th memory chips 1101, 1102, 1103, . . . , 110N may be sequentially read (refer to FIG. 17B).

If a read operation on at least one of the first to N-th memory chips 1101, 1102, 1103, . . . , 110N has failed as a result of applying the tapped delay td of "0", the first offset is increased by a first value id1, and the tapped delay td is increased by an amount of the first offset having the first value id1. The first value id1 may correspond to the delay value d shown in FIG. 14, and may be the minimum unit time of the tapped delay. Write data is simultaneously written to the first to N-th memory chips 1101, 1102, 1103, . . . , 110N (refer to FIG. 17A) using the strobe signal to which the increased tapped delay td is applied. Thereafter, the training data written to the first to N-th memory chips 1101, 1102, 1103, . . . , 110N may be sequentially read.

While repeatedly performing the write and read operations in the foregoing scheme, if the read operation has passed as a result of applying the tapped delay td increased by the first offset having the sum of first to fourth values id1 to id4 (i.e., td=id1+id2+id3+id4), that tapped delay td is determined to be the minimum pass tapped delay $P_{min}$.

Subsequently, the maximum pass tapped delay $P_{max}$ may be determined while changing the tapped delay by an increasing offset. Referring to a right portion of the graph shown in FIG. 18, the tapped delay td may be initialized to "T" that is the maximum value, and a second offset for determining the maximum pass tapped delay $P_{max}$ may be initialized to "0". The tapped delay td of "T" is applied to the strobe signal, and training data, i.e., write data, is simultaneously written to the first to N-th memory chips 1101, 1102, 1103, . . . , 110N (refer to FIG. 17A). Thereafter, the training data written to the first to N-th memory chips 1101, 1102, 1103, . . . , 110N may be sequentially read.

If a read operation on at least one of the first to N-th memory chips 1101, 1102, 1103, . . . , 110N has failed as a result of applying the tapped delay td of "T", the second offset is increased by a first value dd1, and the tapped delay td is reduced by the second offset having the first value dd1 (i.e., td=T−dd1). The first value dd1 may correspond to the delay value d shown in FIG. 14, and may be the minimum unit time of the tapped delay. Write data is simultaneously written to the first to N-th memory chips 1101, 1102, 1103, . . . , 110N (refer to FIG. 17A) using the strobe signal to which the reduced tapped delay td is applied. Thereafter, the training data written to the first to N-th memory chips 1101, 1102, 1103, . . . , 110N may be sequentially read (refer to FIG. 17B).

While repeatedly performing the write and read operations in the foregoing scheme, if the read operation has passed as a result of applying the tapped delay td reduced by the second offset having the sum of first to fifth values dd1 to dd5 (i.e., td=T−dd1−dd2−dd3−dd4−dd5), that tapped delay td is determined to be the maximum pass tapped delay $P_{max}$.

FIGS. 19A and 19B are tables for describing the writing training operation described with reference to FIG. 18.

FIG. 19A is a table illustrating a process of determining the minimum pass tapped delay $P_{min}$ shown in a left end of FIG. 18.

Referring to FIG. 19A along with FIG. 18, if data is written with the tapped delay td changed by increasing the first offset to have the first value id1 and then read operations are performed, the read operations of all of the first to N-th memory chips 1101, 1102, 1103, . . . , 110N may fail. Thereafter, if data is written with the tapped delay td changed by increasing the first offset to have a sum of the first and second values id1 and id2 and then read operations are performed, the read operations of some of the first to N-th memory chips 1101, 1102, 1103, . . . , 110N may fail, and the other may pass. The foregoing process may be repeatedly performed until a memory chip the read operation of which has failed is not present. As shown in FIGS. 19A and 18, in the case where the first offset is increased to have a sum of the first to fourth values id1 to id4 and thereby the tapped delay td is increased by the amount of the first offset having the sum of the first to fourth values id1 to id4, read operations of all of the first to N-th memory chips 1101, 1102, 1103, . . . , 110N may pass. Therefore, in this case, the corresponding tapped delay td is determined to be the minimum pass tapped delay $P_{min}$. Of course, even when the first offset is increased to a fifth value id5, read operations of all of the first to N-th memory chips 1101, 1102, 1103, . . . , 110N may pass.

FIG. 19B is a table illustrating a process of determining the maximum pass tapped delay $P_{max}$ shown in a right end of FIG. 18.

Referring to FIG. 19B along with FIG. 18, if data is written with the tapped delay td changed by increasing the second offset to have the first value dd1 and then read operations are performed, the read operations of all of the first to N-th memory chips 1101, 1102, 1103, . . . , 110N may fail. Thereafter, if data is written with the tapped delay td changed by increasing the second offset by the second value dd2 and then read operations are performed, the read operations of some of the first to N-th memory chips 1101, 1102, 1103, . . . , 110N may fail, and the other may pass. The foregoing process may be repeatedly performed until a memory chip the read operation of which has failed is not present. As shown in FIGS. 19B and 18, in the case where the second offset is increased to have a sum of the first to fifth values dd1 to dd5 and thereby the tapped delay td is reduced by the amount of the second offset having the sum of the first to fifth values dd1 to dd5, read operations of all of the first to N-th memory chips 1101, 1102, 1103, . . . , 110N may pass. Therefore, in this case, the corresponding tapped delay td is determined to be the maximum pass tapped delay $P_{max}$. Of course, even when the second offset is increased to a sixth value dd6, read operations of all of the first to N-th memory chips 1101, 1102, 1103, . . . , 110N may pass.

After the minimum pass tapped delay $P_{min}$ and the maximum pass tapped delay $P_{max}$ have been determined through the above-mentioned process, the optimum tapped delay td of the strobe signal to be applied in common to the first to N-th memory chips 1101, 1102, 1103, . . . , 110N is determined. For example, the arithmetic mean of the minimum pass tapped delay $P_{min}$ and the maximum pass tapped delay $P_{max}$ may be determined to be the optimum tapped delay.

According to the method described with reference to FIGS. 17A to 19B, training data, i.e., write data, may be simultaneously written to the plurality of memory chips 1101, 1102, 1103, . . . , 110N. Therefore, compared to the method of FIG. 16 of determining the optimum tapped delay in such a way that training data is sequentially written to each of the memory chips 1101, 1102, 1103, . . . , 110N and the written training data is sequentially read, the data program time required for the write training operation may be reduced to 1/N. Thus, the time it takes to determine the optimum tapped delay of the data strobe to be applied in common to the plurality of memory chips may be markedly reduced. Consequently, the write training time may be reduced.

Figure 20:
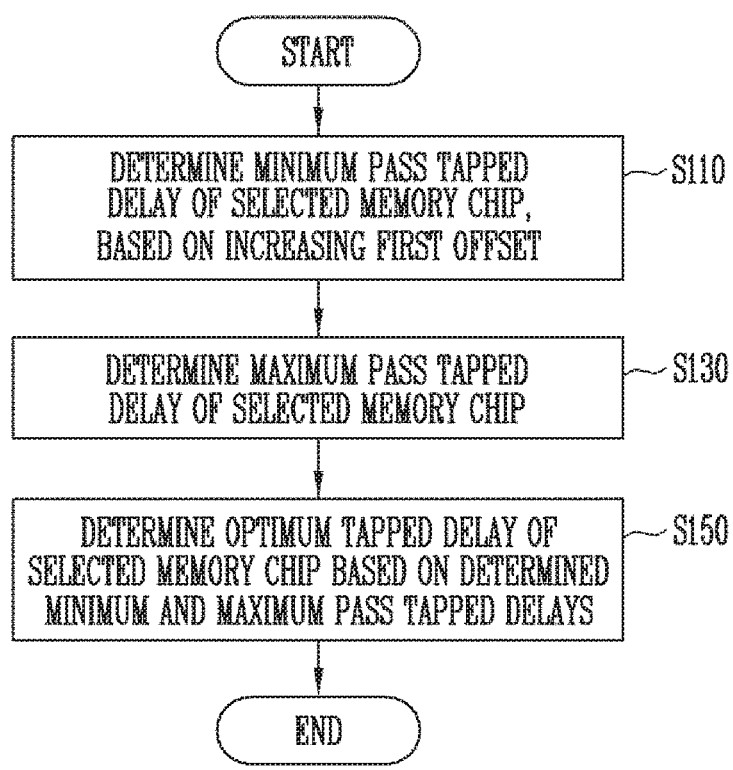
FIG. 20 is a flowchart illustrating a method of operating the controller in accordance with an embodiment of the present disclosure.

FIG. 20 is a flowchart for describing a method of operating the controller in accordance with an embodiment of the present disclosure.

Referring to FIG. 20, there is illustrated a flowchart of the method of determining a tapped delay of a single memory chip described with reference to FIG. 13A to 15B. First, based on an increasing first offset, the minimum pass tapped delay $P_{min}$ of a selected memory chip is determined at step S110. Thereafter, based on an increasing second offset, the maximum pass tapped delay $P_{max}$ of the selected memory chip is determined at step S130. Subsequently, based on the determined minimum and maximum pass tapped delays $P_{min}$ and $P_{max}$, the optimum tapped delay of the selected memory chip is determined at step S150.

An embodiment of step S110 will be described in detail with reference to FIG. 21A. Furthermore, an embodiment of step S130 will be described in detail with reference to FIG. 21B. Although FIG. 20 illustrates an example where step S130 is performed after step S110 has been performed, the present disclosure is not limited to this sequence. In other words, the maximum pass tapped delay of the selected memory chip may be determined before the minimum pass tapped delay of the selected memory chip is determined.

At step S150, an appropriate value between the determined minimum pass tapped delay $P_{min}$ and the determined maximum pass tapped delay $P_{max}$ may be determined to be the optimum tapped delay td. For example, the arithmetic mean of the minimum pass tapped delay $P_{min}$ and the maximum pass tapped delay $P_{max}$ may be determined to be the optimum tapped delay.

Figure 21A:
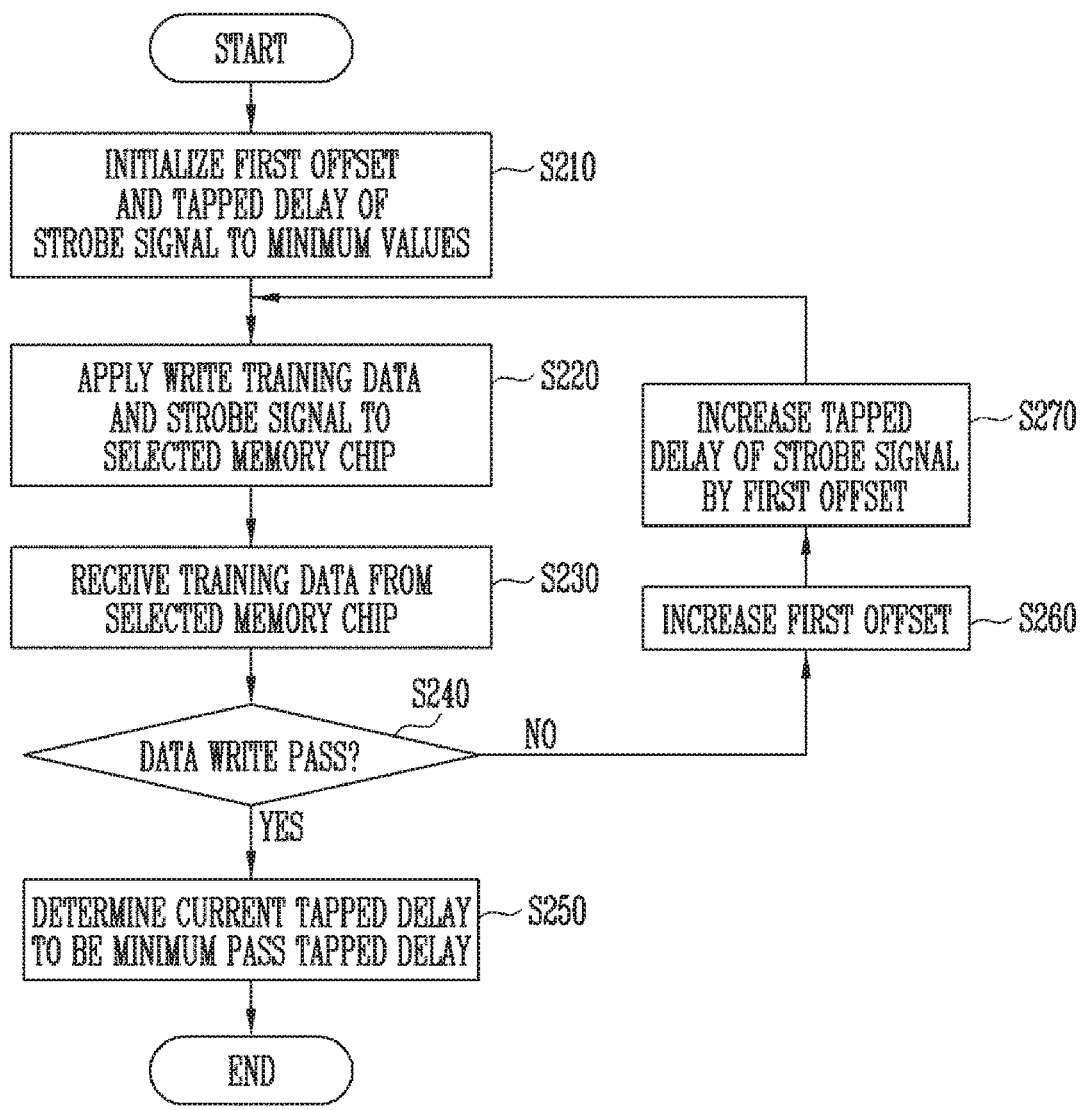
FIG. 21A is a flowchart illustrating in more detail the step of determining the minimum pass tapped delay of FIG. 20.

FIG. 21A is a flowchart for describing in more detail step S110 of determining the minimum pass tapped delay of FIG. 20. Reference is also made to FIGS. 13A, 13B.

First, at step S210, the tapped delay td of the strobe signal and the first offset are initialized to their respective minimum values. For example, as shown in FIG. 15, the tapped delay td and the first offset are both initialized to "0".

Thereafter, at step S220, write training data and the strobe signal are applied to the selected memory chip. At step S220, as shown in FIG. 13A, the write training data may be transmitted to the selected memory chip 1101. In addition, the strobe signal having the tapped delay td of "0" is applied to the selected memory chip 1101.

Thereafter, at step S230, the training data is received from the selected memory chip 1101. As shown in FIG. 13B, step S230 may be performed by reading the training data written to the selected memory chip 1101.

At step S240, it is determined whether the data write operation has passed. As a result of the determination, if the data write operation has failed, the process proceeds to step S260 to increase the first offset. The first offset that has been initialized to "O" is increased by the first value id1, and have the first value dd1. Subsequently, the process proceeds to step S270 so that the tapped delay td of the strobe signal is increased by the first offset having the first value id1. Thereafter, the process proceeds to step S220 again, and the training data is written to the selected memory chip.

The above-mentioned process is repeatedly performed, so that the first offset may be successively increased by additional increments id2 and id3 and finally by the fourth value id4 shown in FIG. 15A. The tapped delay td may also be repeatedly increased by the first offset during the above-mentioned process. At step S240, if the data write operation has passed in response to the strobe signal having the tapped delay td increased by the first offset, which value is the sum of the first to fourth values id1 to id4, is applied, the process proceeds to step S250, where the sum of the first to fourth values id1 to id4 (i.e., id1+id2+id3+id4) that is the current tapped delay is determined to be the minimum pass tapped delay $P_{min}$.

Figure 21B:
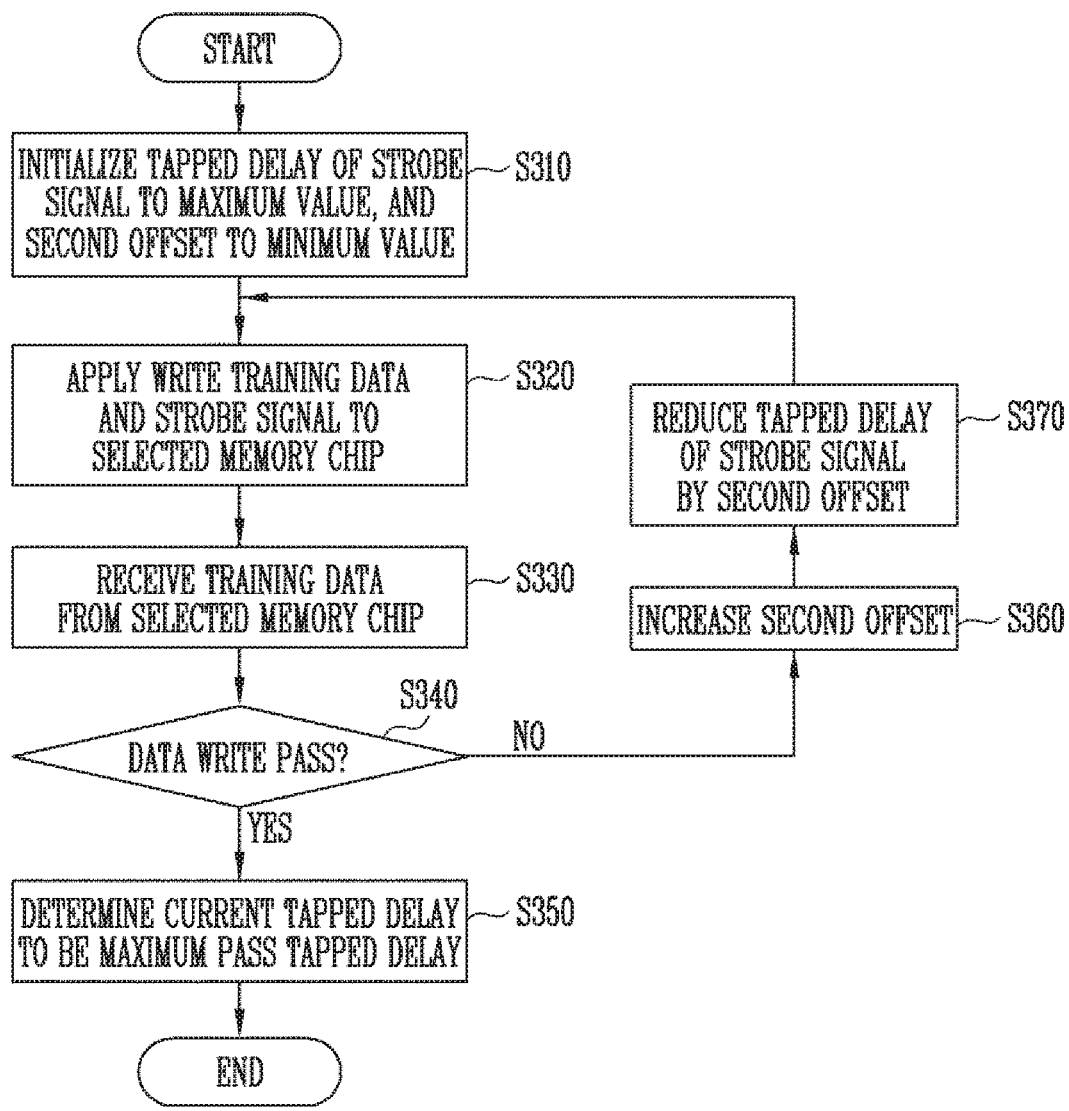
FIG. 21B is a flowchart illustrating in more detail the step of determining the maximum pass tapped delay of FIG. 20.

FIG. 21B is a flowchart for describing in more detail the step of determining the maximum pass tapped delay of FIG. 20.

Such description is also made with reference also to FIGS. 13A, 13B, and 15B.

First, at step S310, the tapped delay td of the strobe signal is initialized to the maximum value, and the second offset is initialized to the minimum value. As shown in FIG. 15, at step S310, the tapped delay td is initialized to "T", and the second offset is initialized to "0".

Thereafter, at step S320, write training data and the strobe signal are applied to the selected memory chip. At step S320, as shown in FIG. 13A, the write training data may be transmitted to the selected memory chip 1101. In addition, the strobe signal having the tapped delay td of "T" is applied to the selected memory chip 1101.

Thereafter, at step S330, the training data is received from the selected memory chip 1101. As shown in FIG. 13B, step S330 may be performed by reading the training data written to the selected memory chip 1101.

At step S340, it is determined whether the data write operation has passed. As a result of the determination, if the data write operation has failed, the process proceeds to step S360 to increase the second offset. The second offset that has been initialized to "0" is increased by, and thus to have, the first value dd1. Subsequently, the process proceeds to step S370 so that the tapped delay td of the strobe signal is reduced by the second offset having the first value dd1. Thereafter, the process proceeds to step S320 again, and the training data is written to the selected memory chip.

The above-mentioned process is repeatedly performed, so that the second offset may be successively increased by increments up to the fifth value dd5 shown in FIG. 15B. The tapped delay td may also be repeatedly reduced by the second offset during the above-mentioned process. At step S340, if the data write operation has passed in response to the strobe signal having the tapped delay td reduced by the second offset, which has a value of the sum of the first to fifth values dd1 to dd5, is applied, the process proceeds to step S350, where the value of the initial tapped delay minus the sum of the first to fifth values dd1 to dd5 (i.e., T−dd1−dd2−dd3−dd4−dd5) that is the current tapped delay is determined to be the maximum pass tapped delay $P_{max}$.

FIG. 22 is a flowchart illustrating a method of operating the controller in accordance with an embodiment of the present disclosure.

Referring to FIG. 22, there is illustrated a flowchart of the method of determining a tapped delay of a plurality of memory chips described with reference to FIG. 17A to 19B. First, based on an increasing first offset, a minimum pass tapped delay $P_{min}$ of a plurality of memory chips 1101, 1102, 1103, . . . , 110N is determined at step S410. Thereafter, based on an increasing second offset, a maximum pass tapped delay $P_{max}$ of the plurality of memory chips 1101, 1102, 1103, . . . , 110N is determined at step S430. Subsequently, based on the determined minimum and maximum pass tapped delays $P_{min}$ and $P_{max}$, the optimum tapped delay of the plurality of memory chips 1101, 1102, 1103, . . . , 110N is determined at step S450.

An embodiment of step S410 will be described in detail with reference to FIG. 23A. Furthermore, an embodiment of step S430 will be described in detail with reference to FIG. 23B. Although in FIG. 22 there is illustrated an example where step S430 is performed after step S410 has been performed, the present disclosure is not limited to this sequence. In other words, the maximum pass tapped delay of the plurality of memory chips 1101, 1102, 1103, . . . , 110N may be determined before the minimum pass tapped delay of the plurality of memory chips 1101, 1102, 1103, . . . , 110N is determined.

At step S450, an appropriate value between the determined minimum pass tapped delay $P_{min}$ and the determined maximum pass tapped delay $P_{max}$ may be determined to be the optimum tapped delay td. For example, the arithmetic mean of the minimum pass tapped delay $P_{min}$ and the maximum pass tapped delay $P_{max}$ may be determined to be the optimum tapped delay.

FIG. 23A is a flowchart for describing in more detail the step of determining the minimum pass tapped delay of FIG. 22. Such description is also made with reference also to FIGS. 17A, 17B, and 18.

First, at step S510, the tapped delay td of the strobe signal and the first offset are initialized to their respective minimum values. For example, as shown in FIG. 18, the tapped delay td and the first offset are both initialized to "0".

Thereafter, at step S515, the first to N-th memory chips 1101, 1102, 1103, . . . , 110N coupled to a selected channel are enabled. The reason for this is to apply the data and the strobe signal to the first to N-th memory chips 1101, 1102, 1103, . . . , 110N at the same time.

Subsequently, at step S520, the write training data and the strobe signal are applied to the first to N-th memory chips 1101, 1102, 1103, . . . , 110N. At step S520, as shown in FIG. 17A, the write training data may be transmitted to the selected memory chip 1101. In addition, the strobe signal having the tapped delay td of "0" is applied to the selected memory chip 1101.

Thereafter, at step S525, the first memory chip is selected. At step S530, the training data is received from the selected memory chip 1101. As shown in FIG. 17B, step S530 may be performed by reading the training data written to the selected first memory chip 1101.

At step S540, it is determined whether the data write operation has passed. As a result of the determination, if the data write operation has failed, the process proceeds to step S560 to increase the first offset. The first offset that has been initialized to "0" is increased by, and thus to have, the first value id1. Subsequently, the process proceeds to step S570 so that the tapped delay td of the strobe signal is increased by the first offset having the first value id1. Thereafter, the process proceeds to step S520 again, and the training data is written to the first to N-th memory chips 1101, 1102, 1103, . . . , 110N.

The above-mentioned process is repeatedly performed, such that the first offset may be successively increased until it has the sum of the first to fourth values id1 to id4 shown in FIG. 18. The tapped delay td may also be repeatedly increased by the first offset during the above-mentioned process. At step S540, if the data write operation has passed in response to the strobe signal having the tapped delay td increased by the first offset, having the sum of the first to fourth values id1 to id4, is applied, the process proceeds to step S542 to determine whether the corresponding memory chip is the N-th memory chip, i.e., the last memory chip. If the corresponding memory chip is not the last memory chip, the process proceeds to step S543 so that the second memory chip which is a subsequent memory chip is selected. Thereafter, steps S530, S540, and S541 are performed again with regard to the second memory chip. In this way, only when the data write operations of all of the first to N-th memory chips 1101, 1102, 1103, . . . , 110N have passed may the process proceed to step S550, but if a data write operation of any one of first to N-th memory chips 1101, 1102, 1103, . . . , 110N has not passed, the process proceeds to step S560.

If the data write operations of all of the first to N-th memory chips 1101, 1102, 1103, . . . , 110N have passed, the process proceeds to step S550, and the sum of the first to fourth values id1 to id4 (i.e., id1+id2+id3+id4) that is the current tapped delay is determined to be the minimum pass tapped delay $P_{min}$.

Figure 23B:
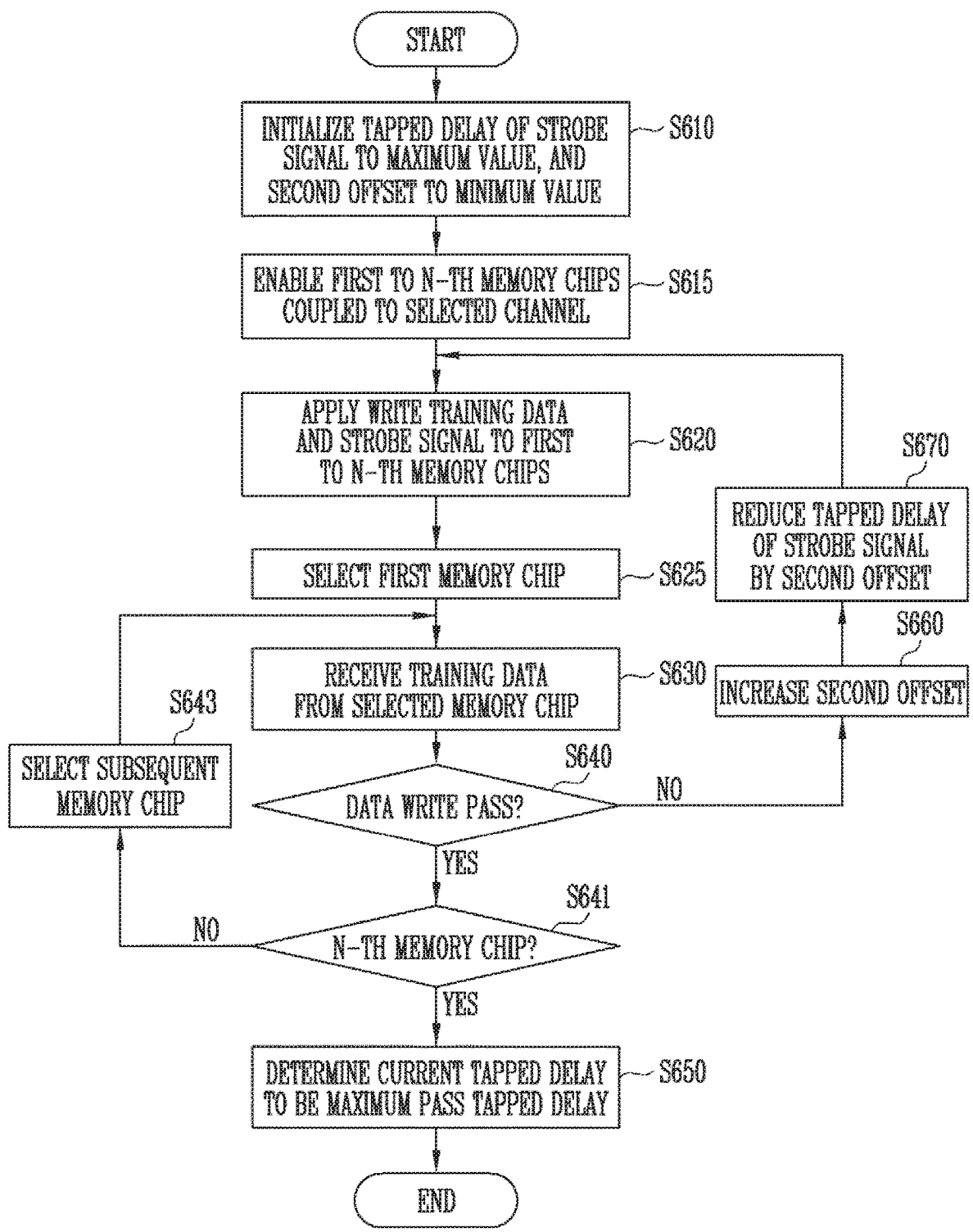
FIG. 23B is a flowchart illustrating in more detail the step of determining the maximum pass tapped delay of FIG. 22.

FIG. 23B is a flowchart for describing in more detail the step of determining the maximum pass tapped delay of FIG. 22. The process shown in FIG. 23B includes steps S610 to S650, and is performed in a manner substantially similar to that of the process of determining the minimum pass tapped delay shown in FIG. 23A. Therefore, common aspects are not described again.

First, at step S610, the tapped delay td of the strobe signal is initialized to the maximum value, and the second offset is initialized to the minimum value. For example, as shown in FIG. 18, at step S610, the tapped delay td is initialized to "T", and the second offset is initialized to "0".

Thereafter, at step S615, the first to N-th memory chips 1101, 1102, 1103, . . . , 110N coupled to a selected channel are enabled. The reason for this is to apply the data and the strobe signal to the first to N-th memory chips 1101, 1102, 1103, . . . , 110N at the same time.

Subsequently, at step S620, the write training data and the strobe signal are applied to the first to N-th memory chips 1101, 1102, 1103, . . . , 110N. Step S620 of FIG. 23B may be performed in a manner substantially similar to that of step S520 of FIG. 23A. However, at step S620, the strobe signal having the tapped delay td of "T" rather than "0" may be applied.

Thereafter, at step S625, the first memory chip is selected. At step S630, the training data is received from the selected memory chip 1101. As shown in FIG. 17B, step S630 may be performed by reading the training data written to the selected first memory chip 1101.

At step S640, it is determined whether the data write operation has passed. As a result of the determination, if the data write operation has failed, the process proceeds to step S660 to increase the second offset. The second offset that has been initialized to "0" is increased by and to the first value dd1. Subsequently, the process proceeds to step S670 so that the tapped delay td of the strobe signal is reduced by the second offset having the first value dd1. Thereafter, the process proceeds to step S620 again, and the training data is written to the first to N-th memory chips 1101, 1102, 1103, . . . , 110N.

The above-mentioned process is repeatedly performed, such that the second offset may be successively increased until it has the sum of the first to fifth values dd1 to dd5 shown in FIG. 18. At step S640, if the data write operation has passed in response to the strobe signal having the tapped delay td reduced by the second offset, having the sum of the first to fifth values dd1 to dd5, is applied, the process proceeds to step S642 to determine whether the corresponding memory chip is the N-th memory chip, i.e., the last memory chip. If the corresponding memory chip is not the last memory chip, the process proceeds to step S643 so that the second memory chip which is a subsequent memory chip is selected. Thereafter, steps S630, S640, and S641 are performed again with regard to the second memory chip. In this way, only when the data write operations of all of the first to N-th memory chips 1101, 1102, 1103, . . . , 110N have passed may the process proceed to step S650, but if a data write operation of any one of first to N-th memory chips 1101, 1102, 1103, . . . , 110N has not passed, the process proceeds to step S660.

If the data write operations of all of the first to N-th memory chips 1101, 1102, 1103, . . . , 110N have passed, the process proceeds to step S650, and the value of the initial tapped delay minus the sum of the first to fifth values dd1 to dd5 (i.e., T−dd1−dd2−dd3−dd4−dd5) that is the current tapped delay is determined to be the maximum pass tapped delay $P_{max}$.

Figure 24A:
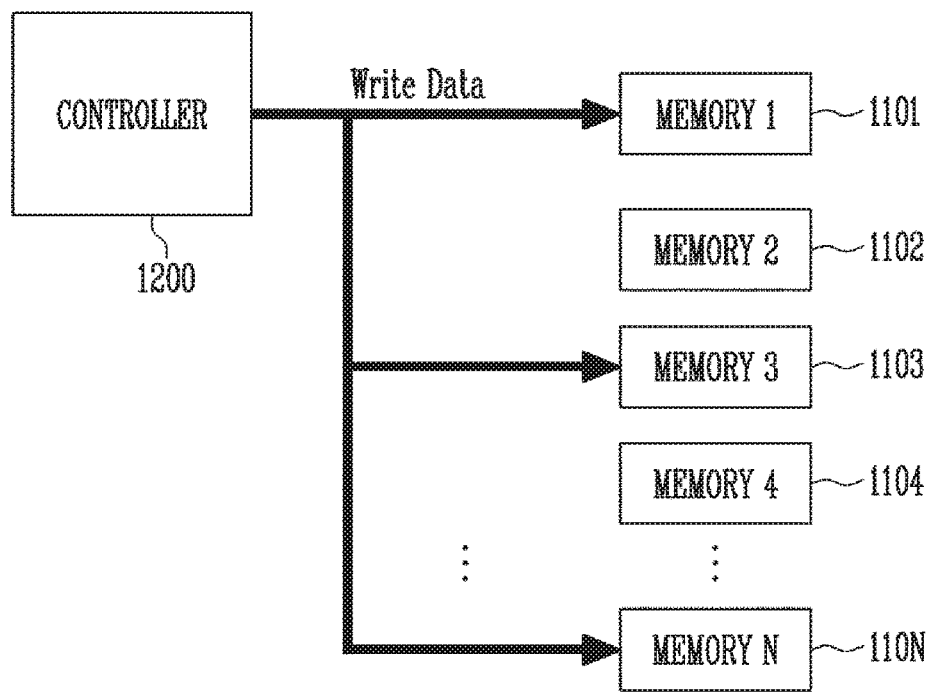
FIGS. 24A and 24B are block diagrams illustrating an embodiment in which a write training operation is performed on some training chips of a plurality of memory chips.
Figure 24B:
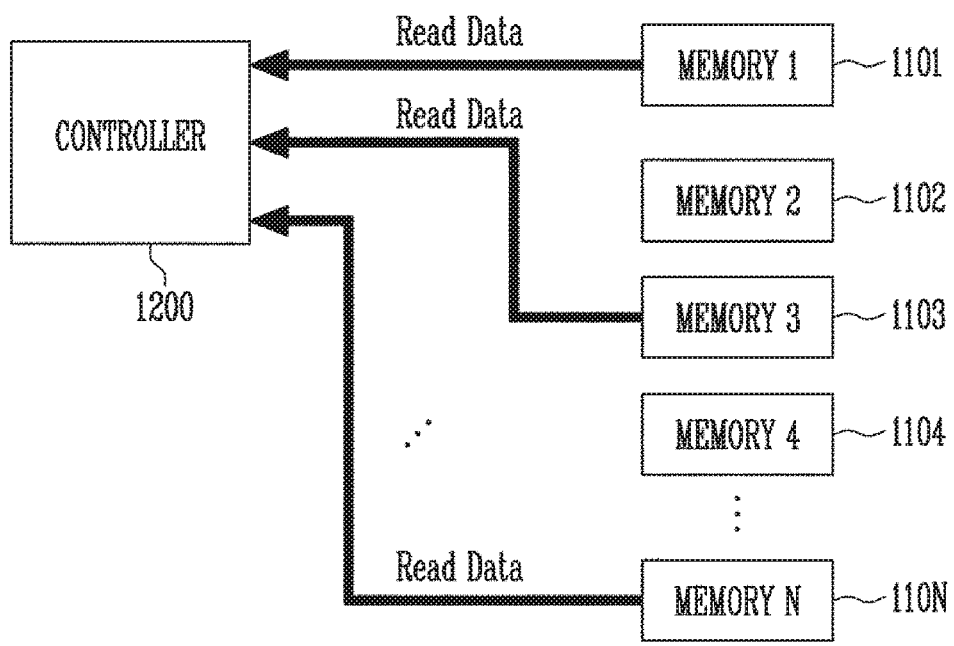

FIGS. 24A and 24B are block diagrams for describing an embodiment in which a write training operation is performed on some training chips of a plurality of memory chips.

Unlike the embodiment of FIGS. 17A and 17B, referring to FIGS. 24A and 24B, a write training operation may be performed on some memory chips 1101, 1103, and 110N of all the memory chips. For example, memory chips having unsuitable strobe signal characteristics may be selected, and the write training operation may be performed on the selected memory chips. Therefore, the time it takes to perform the write training operation may be reduced.

Target memory chips for the write training operation may be selected based on various criteria. For instance, a memory chip having a longest connection line from the controller 1200 or a memory chip having a shortest connection line may be selected as a target for the write training operation.

FIG. 25 is a flowchart for describing a write training method according to the embodiment of FIGS. 24A and 24B.

Referring to FIG. 25, it is to be noted that the write training method according to the present embodiment is substantially the same as that of the embodiment of FIG. 22, except that the present embodiment further includes step S705 of selecting a training chip on which the write training operation is to be performed among all of the memory chips, and step S770 of performing a write test on all of the memory chips based on a determined optimum tapped delay. Therefore, repetitive explanations of steps S705 to S750 will be omitted.

At step S705, as shown in FIGS. 24A and 24B, memory chips on which the write training operation is to be performed may be selected. As described above, the target memory chips for the write training operation may be selected based on various criteria. For example, a memory chip having a longest connection line from the controller 1200 or a memory chip having a shortest connection line may be selected as targets for the write training operation. In the present embodiment, a memory chip selected as a target for the write training operation may be referred to as "training chip".

Thereafter, based on an increasing first offset, a minimum pass tapped delay $P_{min}$ of the selected memory chips 1101, 1103, . . . , 110N, i.e., the training chips, is determined at step S710. Subsequently, based on an increasing second offset, a maximum pass tapped delay $P_{max}$ of the selected memory chips 1101, 1103, . . . , 110N, i.e., the training chips, is determined at step S730. Subsequently, based on the determined minimum and maximum pass tapped delays $P_{min}$ and $P_{max}$, the optimum tapped delay of the training chips 1101, 1103, . . . , 110N is determined at step S750.

A detailed embodiment of step S710 may be performed in a manner similar to that of the embodiment described with reference to FIG. 23A. However, at steps S525, S540, S541, S543, and S550 of FIG. 23A, it is determined whether the data write operation on each of all the memory chips has passed, and if the data write operation has not passed, a subsequent memory chip is selected. In the embodiment shown in FIG. 25, at step S730, it is determined whether the data write operation on each of the training chips of all the memory chips has passed, and if the data write operation has not passed, a subsequent training chip is selected. In this case, the write training operation may not be performed on memory chips that are not selected as training chips.

A detailed embodiment of step S730 may be performed in a manner similar to that of the embodiment described with reference to FIG. 23B. However, at steps S625, S640, S641, S643, and S650 of FIG. 23B, it is determined whether the data write operation on each of all the memory chips has passed, and if the data write operation has not passed, a subsequent memory chip is selected. In the embodiment shown in FIG. 25, at step S730, it is determined whether the data write operation on each of the training chips of all the memory chips has passed, and if the data write operation has not passed, a subsequent training chip is selected. In this case, the write training operation may not be performed on memory chips that are not selected as training chips.

At step S750, an appropriate value between the determined minimum pass tapped delay $P_{min}$ and the determined maximum pass tapped delay $P_{max}$ may be determined to be the optimum tapped delay td. For example, the arithmetic mean of the minimum pass tapped delay $P_{min}$ and the maximum pass tapped delay $P_{max}$ may be determined to be the optimum tapped delay. According to steps S705, S710, S730, and S750 shown in FIG. 25, some memory chips having unsuitable strobe characteristics among all the memory chips may be selected, and the write training operation may be performed on the selected memory chips. Therefore, compared to the embodiment shown in FIG. 22, the speed of the write training operation of determining the optimum tapped delay may be enhanced.

However, steps S705, S710, S730, and S750 shown in FIG. 25 are directed to only the training chips, which represent some but not all of all the memory chips. Therefore, with regard to the other memory chips, i.e., non-training memory chips, it is additionally required to determine whether the write operation has passed based on the optimum tapped delay.

Hence, according to the embodiment shown in FIG. 25, at additional step S770, a write test for all the memory chips may be performed based on the determined optimum tapped delay. At step S770, rather than performing the whole process of the write training operation on all the memory chips, only a data write operation on each of the memory chips is performed once in response to a strobe signal generated by the determined optimum tapped delay, and it is determined only whether the data write operation has passed. As a result of performing step S770, if the data write operation on all the memory chips based on the determined optimum tapped delay has passed, the corresponding optimum tapped delay may be allowed to be used.

As a result of performing step S770, if the data write operation on all the memory chips based on the determined optimum tapped delay has not passed, the corresponding optimum tapped delay may not be allowed to be used. In this case, memory chips on which the data write operations have failed may be selected as additional training chips, and steps S705, S710, S730, S750, and S770 shown in FIG. 25 may be performed again. Thereby, not only may the optimum tapped delay by the write training operation be rapidly determined, but data write pass for all the memory chips based on the optimum tapped delay may also be secured.

Figure 26:
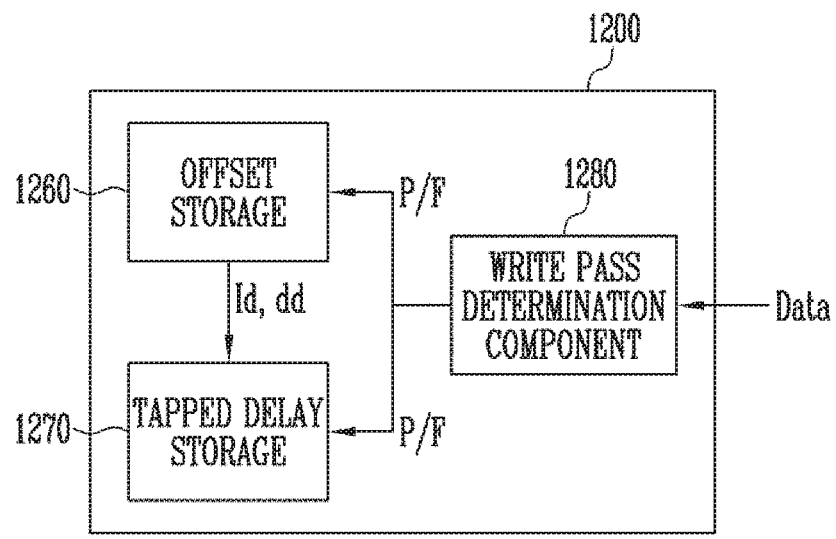
FIG. 26 is a block diagram illustrating a controller in accordance with an embodiment of the present disclosure.

FIG. 26 is a block diagram illustrating the controller 1200 in accordance with an embodiment of the present disclosure. Referring to FIG. 26, the controller 1200 further includes an offset storage 1260, a tapped delay storage 1270, and a write pass determination component 1280. In the controller 1200 of FIG. 26, the offset storage 1260 and the tapped delay storage 1270 may be embodied in the RAM 1210 shown in FIG. 2. Furthermore, the write pass determination component 1280 may be embodied in the processor 1220 shown in FIG. 2. In this case, the write pass determination component 1280 may be embodied in the form of firmware which is executed by the processor 1220. The write pass determination component 1280 may also be implemented in a suitable combination of software, firmware and hardware.

The write pass determination component 1280 receives data from the semiconductor memory device 1100. The data received by the write pass determination component 1280 may be data written for a write training operation to the memory cell array 110 of the semiconductor memory device 1100, i.e., training data. Based on the received data, the write pass determination component 1280 may determine whether a write operation on the semiconductor memory device 1100 has passed or failed. The write pass determination component 1280 may transmit a message indicating write pass or fail (P/F) to the offset storage 1260 or the tapped delay storage 1270.

In detail, if it is determined that the write operation of the training data has failed, the write pass determination component 1280 may transmit a message indicating the write fail to the offset storage 1260. Based on the message, the offset storage 1260 may increase an offset that has been stored therein, and store the increased offset.

Here, the offset storage 1260 may transmit the increased offset (id, dd) to the tapped delay storage 1270. The offset id may correspond to the first offset described with reference to FIGS. 15A and 18. The offset dd may correspond to the second offset described with reference to FIGS. 15B and 18. The tapped delay storage 1270 may update a tapped delay that has been stored therein, based on the received offsets id and dd. For example, the tapped delay storage 1270 may store a value obtained by adding the offset id to the tapped delay that has been stored, as a new tapped delay. In an embodiment, the tapped delay storage 1270 may store a value obtained by subtracting the offset dd from the tapped delay that has been stored, as a new tapped delay. In this way, each time the write operation of the training data fails the tapped delay value stored in the tapped delay storage 1270 is updated.

If it is determined that a write operation of the training data has passed, the write pass determination component 1280 may transmit a message indicating write pass to the tapped delay storage 1270. Based on the message, the tapped delay storage 1270 may store, as the minimum pass tapped delay or the maximum pass tapped delay, the tapped delay value that is stored at a point in time at which the message is received. In addition, if both the minimum pass tapped delay and the maximum pass tapped delay of the semiconductor memory device 1100 are determined, the tapped delay storage 1270 may determine an optimum pass tapped delay based on the minimum pass tapped delay and the maximum pass tapped delay. For example, the arithmetic mean of the minimum pass tapped delay and the maximum pass tapped delay may be determined to be the optimum tapped delay. The tapped delay storage 1270 may store the determined optimum pass tapped delay.

As such, by the operation of the offset storage 1260, the tapped delay storage 1270, and the write pass determination component 1280, the controller 1200 may rapidly determine the minimum pass tapped delay or the maximum pass tapped delay of the semiconductor memory device 1100, and the optimum pass tapped delay based on the minimum pass tapped delay and the maximum pass tapped delay.

Figure 27:
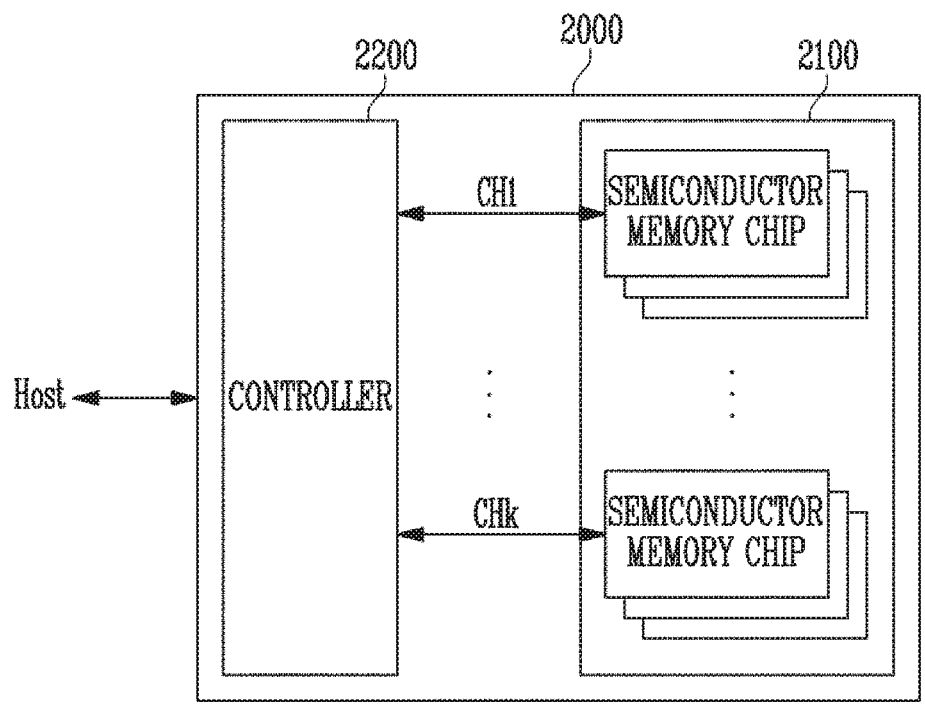
FIG. 27 is a block diagram illustrating an example of application of a memory system of FIG. 8.

FIG. 27 is a block diagram illustrating an example of application of the memory system of FIG. 8.

Referring FIG. 27, a memory system 2000 may include a semiconductor memory device 2100 and a controller 2200. The semiconductor memory device 2100 may include a plurality of semiconductor memory chips. The semiconductor memory chips are divided into a plurality of groups.

In FIG. 27, it is illustrated that first to k-th groups communicate with the controller 2200 through first to k-th channels CH1 to CHk, respectively. Each semiconductor memory chip may be configured and operated in the same manner as those of the memory device 100 described with reference to FIG. 8.

Each group may communicate with the controller 2200 through one common channel. The controller 2200 has the same configuration as that of the controller 1200 described with reference to FIG. 8 and is configured to control a plurality of memory chips of the semiconductor memory device 2100 through the plurality of channels CH1 to CHk.

Figure 28:
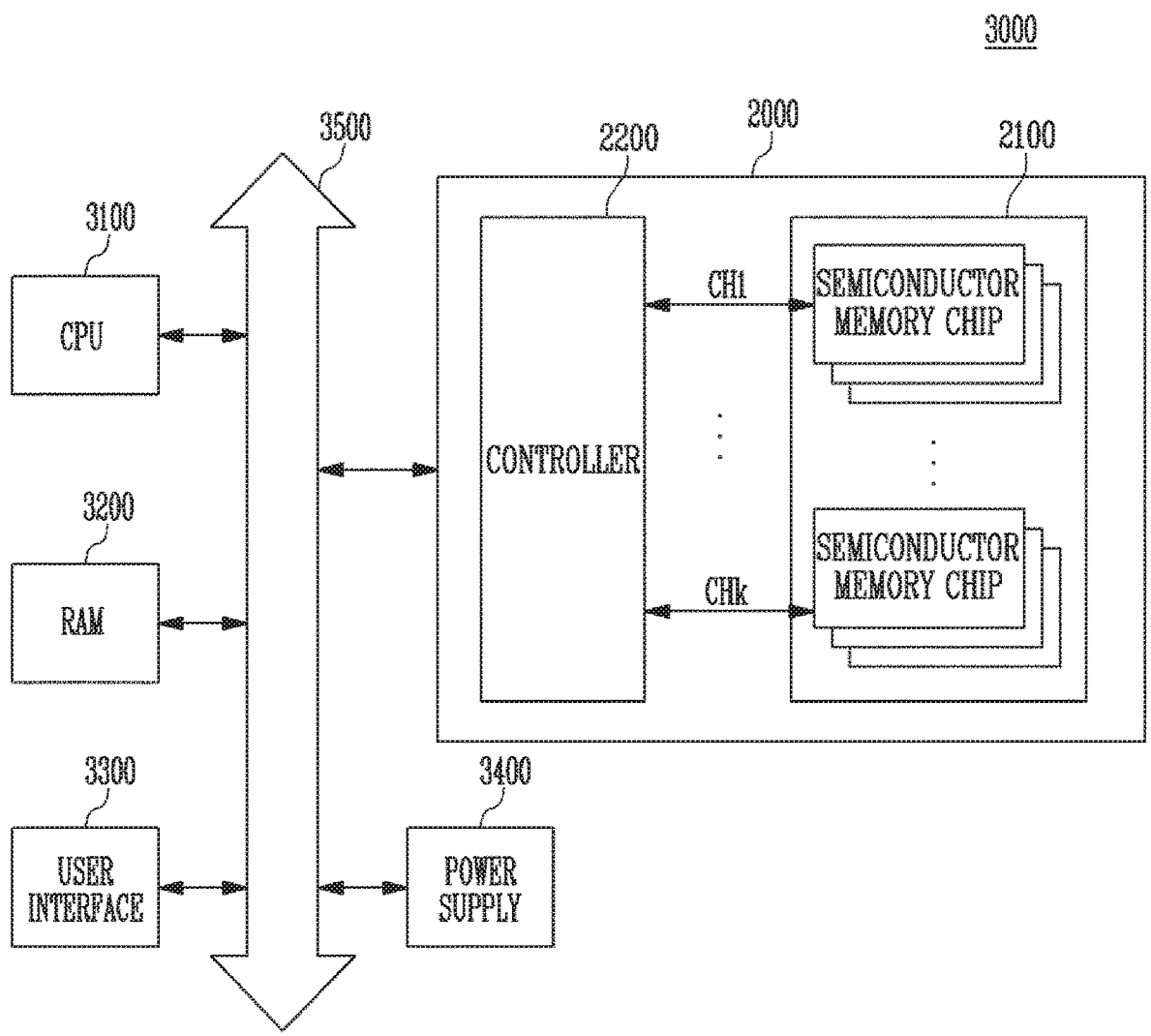
FIG. 28 is a block diagram illustrating a computing system including the memory system illustrated with reference to FIG. 27.

FIG. 28 is a block diagram illustrating an exemplary computing system 3000 including the memory system 2000 described with reference to FIG. 27.

The computing system 3000 may include a central processor (CPU) 3100, a RAM 3200, a user interface 3300, a power supply 3400, a system bus 3500, and the memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 28, the semiconductor memory device 2100 is shown coupled to the system bus 3500 through the controller 2200. However, the semiconductor memory device 2100 may be directly coupled to the system bus 3500. The function of the controller 2200 may be performed by the CPU 3100 and the RAM 3200.

Various embodiments of the present disclosure provide a method of operating a controller capable of enhancing a write training speed of a semiconductor memory device.

Various embodiments of the present disclosure provide a controller capable of enhancing a write training speed of a semiconductor memory device.

Various of embodiments are disclosed herein, and although specific terms are employed, they are used and are to be interpreted in a generic and descriptive sense and not for purpose of limitation. In some instances, as would be apparent to one skilled in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of operating a controller to control an operation of a semiconductor memory device, the method comprising:
   determining a minimum pass tapped delay of the semiconductor memory device based on a first offset;
   determining a maximum pass tapped delay of the semiconductor memory device based on a second offset; and
   determining a tapped delay of the semiconductor memory device based on the determined minimum pass tapped delay and the determined maximum pass tapped delay.

2. The method according to claim 1, wherein the determining of the minimum pass tapped delay comprises:
   initializing the first offset and the tapped delay of a strobe signal;
   applying write training data and the strobe signal to the semiconductor memory device;
   receiving the training data from the semiconductor memory device; and
   determining the minimum pass tapped delay based on whether a write operation of the training data has passed.

3. The method according to claim 2, wherein, in the determining of the minimum pass tapped delay based on whether the write operation of the training data has passed,
   when the write operation of the training data has passed, the tapped delay at a point in time when the write operation passes is determined to be the minimum pass tapped delay.

4. The method according to claim 2, wherein the determining of the minimum pass tapped delay based on whether the write operation of the training data has passed comprises:
   increasing, if the write operation of the training data has failed, the first offset by an increment; and
   increasing the tapped delay by the increased first offset.

5. The method according to claim 4, further comprising, after the increasing of the tapped delay by the increased first offset:
   applying the write training data and the strobe signal having the increased tapped delay to the semiconductor memory device;
   receiving the training data from the semiconductor memory device; and
   determining the minimum pass tapped delay based on whether a write operation of the training data has passed.

6. The method according to claim 1, wherein the determining of the maximum pass tapped delay comprises:
   initializing the second offset and the tapped delay of a strobe signal;
   applying write training data and the strobe signal to the semiconductor memory device;
   receiving the training data from the semiconductor memory device; and
   determining the maximum pass tapped delay based on whether a write operation of the training data has passed.

7. The method according to claim 6, wherein in the determining of the maximum pass tapped delay based on whether the write operation of the training data has passed, when the write operation of the training data has passed, the tapped delay at a point in time when the write operation passes is determined to be the maximum pass tapped delay.

8. The method according to claim 6, wherein the determining of the maximum pass tapped delay based on whether the write operation of the training data has passed comprises:
   increasing, if the write operation of the training data has failed, the second offset by an increment; and
   reducing the tapped delay by the increased second offset.

9. The method according to claim 8, further comprising, after the reducing of the tapped delay by the increased second offset:
   applying the write training data and the strobe signal having the reduced tapped delay to the semiconductor memory device;
   receiving the training data from the semiconductor memory device; and
   determining the maximum pass tapped delay based on whether the write operation of the training data has passed.

10. The method according to claim 4, wherein, as the write operation of the training data repeatedly fails, the first offset is increased after each failure.

11. The method according to claim 8, wherein, as the write operation of the training data repeatedly fails, the second offset is increased after each failure.

12. A method of operating a controller to control a plurality of memory chips sharing a channel, the method comprising:
    determining a minimum pass tapped delay of the plurality of memory chips based on a first offset;
    determining a maximum pass tapped delay of the plurality of memory chips based on a second offset; and
    determining a tapped delay of the plurality of memory chips based on the determined minimum pass tapped delay and the determined maximum pass tapped delay.

13. The method according to claim 12, wherein the determining of the minimum pass tapped delay comprises:
    initializing the first offset and the tapped delay of a strobe signal;
    enabling the plurality of memory chips, and applying write training data and the strobe signal to the plurality of memory chips;
    receiving the training data from the plurality of memory chips; and
    determining the minimum pass tapped delay based on whether a write operation of the training data on the plurality of memory chips has passed.

14. The method according to claim 12, wherein the determining of the maximum pass tapped delay comprises:
    initializing the second offset and the tapped delay of a strobe signal;
    enabling the plurality of memory chips, and applying the write training data and the strobe signal to the plurality of memory chips;
    receiving the training data from the plurality of memory chips; and
    determining the maximum pass tapped delay based on whether a write operation of the training data on the plurality of memory chips has passed.

15. The method according to claim 14, wherein, in the determining of the maximum pass tapped delay based on whether the write operation of the training data on the plurality of memory chips has passed, when the write operation of the training data on all of the plurality of memory chips has passed, the tapped delay at a point in time when the write operation passes is determined to be the maximum pass tapped delay.

16. The method according to claim 14, wherein the determining of the maximum pass tapped delay based on whether the write operation of the training data on the plurality of memory chips has passed comprises:
    increasing, if the write operation of the training data on at least one of the plurality of memory chips fails, the second offset by an increment; and
    reducing the tapped delay by the increased second offset.

17. A controller configured to control an operation of a semiconductor memory device, the controller comprising:
    a write pass determination component configured to receive training data written to the semiconductor memory device, and determine whether a write operation of the semiconductor memory device has passed;
    an offset storage configured to update an offset based on the determination of the write pass determination component, and store the updated offset; and
    a tapped delay storage configured to update, based on the updated offset, a tapped delay to be applied to the write operation of the semiconductor memory device, and store the updated tapped delay.

18. The controller according to claim 17,
    wherein, when the write operation of the training data has failed, the write pass determination component transmits a message indicating that the write operation has failed to the offset storage, and
    wherein the offset storage increases the offset based on the message, and stores the increased offset.

19. The controller according to claim 18,
    wherein the offset storage transmits the increased offset to the tapped delay storage, and
    wherein the tapped delay storage updates the tapped delay based on the increased offset.

20. The controller according to claim 17,
    wherein, when the write operation of the training data has passed, the write pass determination component transmits a message indicating that the write operation has passed to the tapped delay storage, and
    wherein the tapped delay storage determines the tapped delay that is stored therein to be a minimum pass tapped delay or a maximum pass tapped delay based on the message.

21. A controller for performing write test operations to at least one memory device, the controller comprising:
    a processor configured to control the at least one memory device to perform first and second write operations of writing test data thereto, each of the first and second write operations being performed according to respective first and second tapped delays between a data signal and a data strobe signal;
    a write pass determination component configured to determine success or failure of each of the first and second write operations;
    an offset storage configured to store an increasing increment at each successive failure of the first write operations and an increasing decrement at each successive failure of the second write operations; and
    a tapped delay storage configured to store the first tapped delay increased by the amount of the increasing increment and the second tapped delay decreased by the amount of the increasing decrement,
    wherein the processor is, during the first and second write operations of the at least one memory device, configured to:
    determine a minimum pass tapped delay by increasing stepwise, from a minimum tapped delay, the first tapped delay by the amount of the increasing increment after each failure of the first write operations;
    determine a maximum pass tapped delay by decreasing stepwise, from a maximum tapped delay, the second tapped delay by the amount of the increasing decrement after each failure of the second write operations; and
    determine an optimized tapped delay between the minimum pass tapped delay and the maximum pass tapped delay.

22. A memory system comprising:
    at least one memory device; and
    a controller configured to control the at least one memory device to perform first and second write operations of writing a test data thereto, each of the first and second write operations being performed according to respective first and second tapped delays between a data signal and a data strobe signal,
    wherein the controller is, during the first and second write operations of the at least one memory device, configured to:
    determine a minimum pass tapped delay by increasing stepwise, from a minimum tapped delay, the first tapped delay by an amount of an increasing increment after each failure of the first write operations;

determine a maximum pass tapped delay by decreasing stepwise, from a maximum tapped delay, the second tapped delay by an amount of increasing decrement after each failure of the second write operations; and determine an optimized tapped delay between the minimum pass tapped delay and the maximum pass tapped delay.

* * * * *